(12) United States Patent
Oku et al.

(10) Patent No.: US 6,500,752 B2
(45) Date of Patent: Dec. 31, 2002

(54) SEMICONDUCTOR DEVICE AND SEMICONDUCTOR DEVICE MANUFACTURING METHOD

(75) Inventors: Taizo Oku, Tokyo (JP); Junichi Aoki, Tokyo (JP); Youichi Yamamoto, Tokyo (JP); Takashi Koromokawa, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/904,869

(22) Filed: Jul. 16, 2001

(65) Prior Publication Data

US 2002/0011672 A1 Jan. 31, 2002

(30) Foreign Application Priority Data

Jul. 21, 2000 (JP) .......................... 2000-221381
Sep. 18, 2000 (JP) .......................... 2000-281263

(51) Int. Cl.[7] .......................................... H01L 21/4763
(52) U.S. Cl. .................... 438/622; 438/623; 438/624; 438/687; 438/788
(58) Field of Search ................... 438/622, 623, 438/624, 680, 687, 787, 788

(56) References Cited

U.S. PATENT DOCUMENTS

| 5,976,979 | A | * | 11/1999 | Chen ........................... 438/691 |
| 6,133,162 | A | * | 10/2000 | Suzuki et al. ............... 438/780 |
| 6,225,217 | B1 | * | 5/2001 | Usami et al. ............... 438/637 |
| 6,358,838 | B2 | * | 3/2002 | Furusawa et al. .......... 438/622 |

FOREIGN PATENT DOCUMENTS

| EP | 0 881 678 A2 | 5/1998 |
| JP | 11-288931 A | 5/1999 |
| WO | 98/50945 | 7/1997 |

* cited by examiner

Primary Examiner—T. N. Quach
(74) Attorney, Agent, or Firm—Lorusso & Loud

(57) ABSTRACT

The present invention relates to a semiconductor device manufacturing method of forming an inter-wiring layer insulating film having a low dielectric constant to cover a copper wiring. In construction, in a semiconductor device manufacturing method of forming an insulating film 34 having a low dielectric constant on a substrate 20, the insulating film 34 is formed by plasmanizing a film forming gas, that consists of at least any one of alkyl compound having siloxane bonds and methylsilane ($SiH_n(CH_3)_{4-n}$: n=0, 1, 2, 3), any one oxygen-containing gas selected from a group consisting of $N_2O$, $H_2O$, and $CO_2$, and ammonia ($NH_3$) to react.

17 Claims, 17 Drawing Sheets

FIG. 3A

Film Density Measured by the X-Ray Interference Method

| Examined Film Type | PE-CVD TMS SiO$_2$ Film | PE-CVD TEOS SiO$_2$ Film | PE-CVD SiH$_4$ SiO$_2$ Film | Thermal SiO$_2$ Film |
|---|---|---|---|---|
| Film Density (g/cm$^3$) | 2.33 | 2.26 | 2.24~2.30 | 2.23 |

FIG. 3B

Film Density Measured by the Weight Measurement

| Examined Film Type | PE-CVD TMS SiO$_2$ Film | PE-CVD TEOS SiO$_2$ Film | PE-CVD SiH$_4$ SiO$_2$ Film |
|---|---|---|---|
| Film Density (g/cm$^3$) | 2.33 | 2.1~2.2 | 2.20 |

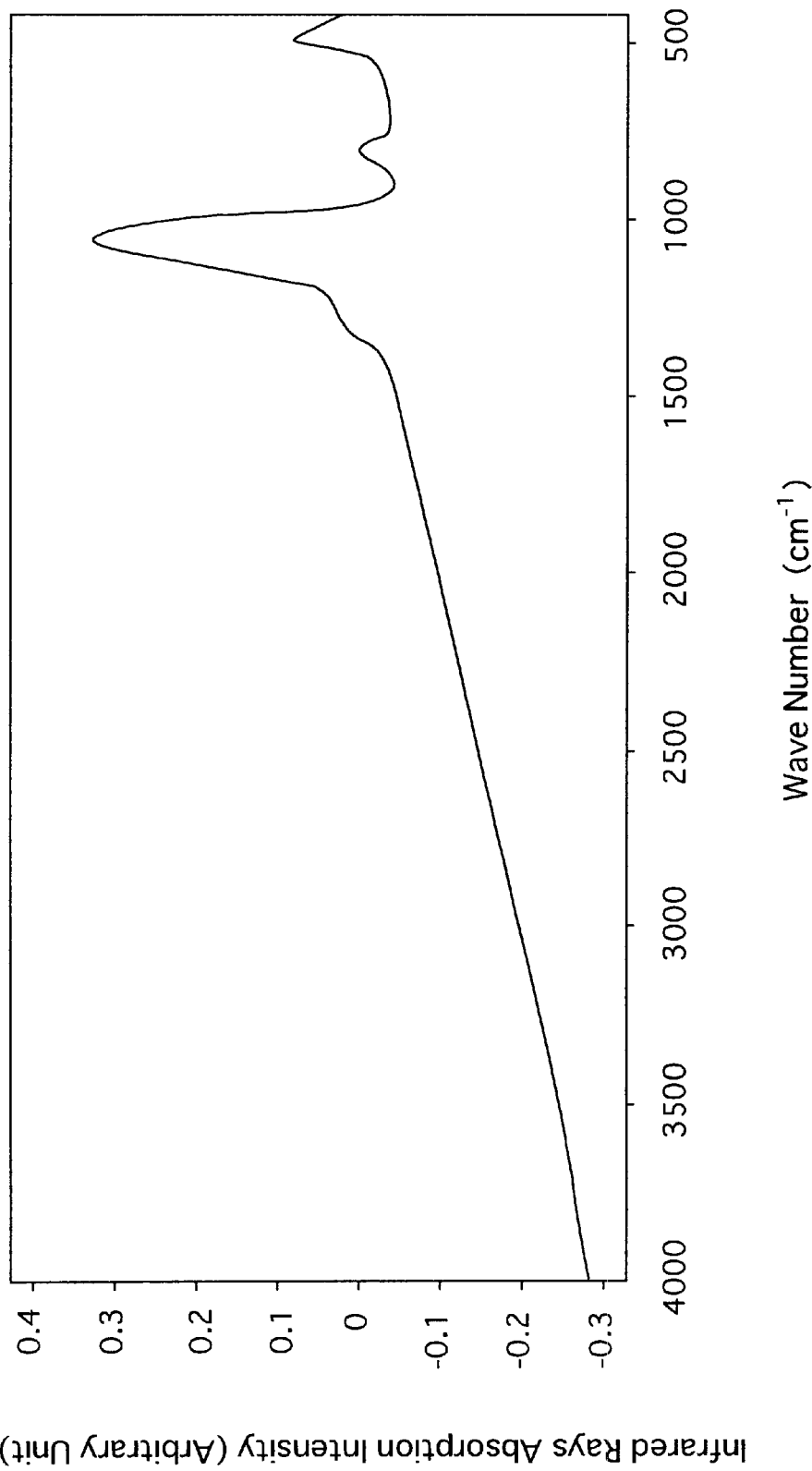

FIG. 8

| Underlying Low Dielectric Constant Insulating Film Type | | Examined Film Type | |
|---|---|---|---|
| | Surface Treatment | PE-CVD TMS SiO$_2$ Film | PE-CVD TEOS SiO$_2$ Film |
| Inorganic Coating Insulating Film k=2.9 | Applied | ○ | △ |
| | Not Applied | ○ | × |
| Organic Coating Insulating Film k=2.8 | Applied | ○ | △ |
| | Not Applied | ○ | × |

.# SEMICONDUCTOR DEVICE AND SEMICONDUCTOR DEVICE MANUFACTURING METHOD

BACKGROUND OF THE INVENTION

1. Field of the Invention

The present invention relates to a semiconductor device and a semiconductor device manufacturing method and, more particularly, a semiconductor device manufacturing method for forming a wiring buried insulating film for burying a wiring formed of a copper film or formed mainly of a copper film, and an inter-wiring layer insulating film that has barrier property to copper.

2. Description of the Prior Art

In recent years, the miniaturization and the reduction in thickness of the pattern are required with the higher integration degree and the higher density of the semiconductor integrated circuit devices. In addition, since the higher speed of the data transfer rate is also required.

Therefore, the insulating film having the low dielectric constant (referred to as a "low dielectric constant insulating film" hereinafter) and the small RC delay is employed. As such insulating film, there are the SiOF film having the relative dielectric constant 3.5 to 3.8, the porous $SiO_2$ film having the relative dielectric constant 3.0 to 3.1, etc., for example.

In the meanwhile, the wiring material is being changed from the conventional aluminum (Al) to the wiring formed of the copper (Cu) film having a low electric resistance or formed mainly of the copper film (referred to as a "copper wiring" hereinafter).

Therefore, in order to manufacture the semiconductor device having the multi-layered copper wiring, the low dielectric constant insulating film is formed as the interlayer insulating film on the copper wiring in the prior art. In this case, since normally the copper is ready to diffuse from the copper wiring into the low dielectric constant insulating film, the leakage current between upper and lower wirings is increased. Accordingly, in order to prevent the diffusion of the copper element into the low dielectric constant insulating film, the barrier insulating film containing Si and N or Si and C is often interposed between the copper wiring and the low dielectric constant insulating film.

However, the insulating film containing Si and N has the high relative dielectric constant. Therefore, even if such insulating film of the thinner film thickness is employed as the barrier insulating film, the dielectric constant of the overall interlayer insulating film is increased.

Also, the relative dielectric constant of the barrier insulating film containing Si and C is relatively low such as about 5 rather than the barrier insulating film containing Si and N. But such barrier insulating film containing Si and C cannot sufficiently suppress the increase in the leakage current. In this case, in order to suppress sufficiently the leakage current, further the oxygen must be introduced into the barrier insulating film containing Si and C.

The leakage current can be reduced to a sufficient level by doing so. However, the new problem is caused such that the surface of the copper wiring is oxidized and thus the barrier insulating film and the low dielectric constant insulating film are easily peeled off.

SUMMARY OF THE INVENTION

It is an object of the present invention to provide a semiconductor device and a semiconductor device manufacturing method capable of preventing peeling-off of an insulating film for covering a wiring made of only or mainly a copper film and achieving a low dielectric constant of an interlayer insulating film between wirings made of copper film etc. while maintaining a high barrier characteristic to a copper and a small leakage current, like the silicon nitride film, when an inter-wiring layer insulating film into which a connecting conductor is buried and a wiring-buried insulating film into which the copper wiring is buried are formed.

Advantages that can be achieved by the configuration of the present invention will be explained hereunder.

The PE-CVD TMS $SiO_2$ film according to the present invention has a peak of an absorption intensity of an infrared rays in a range of a wave number 2270 to 2350 $cm^{-1}$, a film density in a range of 2.25 to 2.40 $g/cm^3$, and a relative dielectric constant in a range of 3.3 to 4.3.

According to the experiment by the inventor of the present invention, the PE-CVD TMS $SiO_2$ film having the aforementioned characteristics has a high mechanical strength, is dense, has a high water resistance, and has a small content of moisture similarly to a silicon nitride film, and is a lower relative dielectric constant than the silicon nitride.

The semiconductor device of the present invention has a protection layer covering a wiring made only or mainly of a copper film, and the protection layer is formed of the PE-CVD TMS $SiO_2$ film having the aforementioned characteristics. Accordingly, since the protection layer is dense similarly to a silicon nitride, it can prevent the copper from diffusing from the wiring to a periphery thereof.

Further, an inter-wiring layer insulating film having the aforementioned characteristics is interposed between the lower wiring and the upper wiring. Therefore, the inter-wiring layer insulating film can prevent the copper from diffusing from the wiring to a periphery thereof, while the semiconductor device maintains a lower dielectric constant.

Moreover, the semiconductor device has a main insulating film, protection layers covering it in both a lower surface and an upper surface. In other words, the protection layers having the aforementioned characteristics are interposed both between the lower wiring and the main insulating film and between the upper wiring and the main insulating film, respectively. Therefore, the protection layers can prevent the copper from diffusing from the wirings to the main insulating film.

Further, employing a porous insulating film or a coating insulating film having a lower dielectric constant as the main insulating film results in preventing the copper from diffusing from the wirings to the main insulating film, while maintaining a lower dielectric constant.

The insulating film is formed by plasmanizing the film forming gas, that consists of any one selected from the group consisting of the alkoxy compound having Si—H bonds and the siloxane having Si—H bonds and any one oxygen-containing gas selected from the group consisting of $O_2$, $N_2O$, $NO_2$, CO, $CO_2$, and $H_2O$, to react.

According to the experiment, it is found that the silicon-containing insulating film, that formed by plasmanizing the film forming gas that consists of any one selected from the group consisting of the alkoxy compound having Si—H bonds and the siloxane having Si—H bonds and any one oxygen-containing gas selected from the group consisting of $O_2$, $N_2O$, $NO_2$, CO, $CO_2$, and $H_2O$ to react, is dense, is excellent in the water resistance, and has the small amount of contained moisture in the film, that are equivalent to the silicon nitride film, and has the smaller relative dielectric constant than the silicon nitride film.

Therefore, in the method of manufacturing the semiconductor device in which the inter-wiring layer insulating film is put between the lower wiring-buried insulating film into which the lower wiring formed of the copper film or formed mainly of the copper film is buried and the upper wiring-buried insulating film into which the upper wiring formed of the copper film or formed mainly of the copper film is buried, the inter-wiring layer insulating film is formed by the above film forming condition. In other words, since the inter-wiring layer insulating film is interposed between the lower wiring and upper wiring, the diffusion of the copper from the lower wiring and the upper wiring can be prevented without the barrier insulating film and also the semiconductor can achieve the lower dielectric constant in the overall insulating film between the wirings.

Also, the main insulating films and the protection layers made of the silicon-containing film of the present invention are laminated alternatively in this order from a bottom to form two or more inter-wiring layer insulating films and two or more wiring buried insulating films alternatively in this order from a bottom. The inter-wiring layer insulating films and the wiring buried insulating films include at least the main insulating film and the protection layer, respectively. Then via holes and wiring recesses are formed alternatively in the inter-wiring layer insulating films and the wiring-buried insulating films, and then a metal consisting only or mainly of a copper film is buried in the via holes and the wiring recesses to form the, connecting conductor and the wiring connecting to the connecting conductor. In this case, the method of forming the connecting conductor and the copper wiring by laminating the inter-wiring layer insulating films and the wiring-buried insulating films, then forming the via hole and the wiring recess therein, and then filling the copper film or the like in the via hole and the wiring recess is referred to as the so-called dual damascene method.

According to the above structure, since the protection layer is interposed between the wiring made of the copper film or the like and the main insulating film, the diffusion of the copper from the copper wirings into the main insulating film can be prevented.

Also, if the main insulating film is formed of the SiOF film, for example, the diffusion of the fluorine (F) element into the peripheral portions can be prevented by the protection layer made of the silicon-containing insulating film of the present invention.

In addition, since the protection layer is formed of not the silicon nitride film but the insulating film having a low relative dielectric constant, the dielectric constant can be reduced in the overall insulating film between the wirings.

Further, since the protection layer made of the silicon-containing insulating film of the present invention is formed to cover the lower wiring, the diffusion of the copper into the peripheral portions can be prevented.

Furthermore, since the silicon-containing insulating film of the present invention has essentially the small leakage current like the silicon nitride film, the introduction of the oxygen is not needed to reduce the leakage current, unlike the insulating film containing Si and C. Although the protection layer and the inter-wiring layer insulating film that contact to the wiring made of copper or the like are ready to peel off if the surface of the wiring made of copper or the like is oxidized by the introduced oxygen or the oxygen introducing process, there is no possibility of that peeling-off in the present invention.

Moreover, if the main insulating film is formed of the coating insulating film, the peeling-off of the film can be prevented and also the discharge of the moisture from the coating insulating film into the peripheral portions can be prevented more completely since the protection layer of the present invention has the good adhesiveness to the coating insulating film.

Besides, the semiconductor is formed of, from the bottom, the inter-wiring layer insulating film and the wiring-buried insulating film formed by laminating sequentially two or more sets of the insulating films and the protection layers made of the silicon-containing insulating film according to the present invention, and then the via holes and the wiring recesses connected to the via holes are formed alternatively to pass through the inter-wiring layer insulating film and the wiring-buried insulating film such that their opening areas are expanded sequentially from the lower side respectively. In other words, the protection layer is exposed from the insulating film that is to be etched, or acts as the underlying film of the insulating film that is to be etched when the insulating film is selectively etched. In this case, since the protection layer of the present invention is dense, such film can effectively function as the mask or such film can effectively function as the stopper to prevent the excessive etching of the insulating film formed under the protection layer.

BRIEF DESCRIPTION OF THE DRAWINGS

FIG. 3A and FIG. 3B are tables showing examined results of a film density of the insulating film that is formed by the film forming method according to the second embodiment of the present invention using the sample of FIG. 2A;

FIG. 5B is a graph showing examined results of an infrared absorption intensity of the silicon-containing insulating film that is formed by the film forming method according to a second embodiment of the present invention using the comparative sample of FIG. 2A;

FIG. 8 is a table showing examined results of an adhesiveness of the silicon-containing insulating film, that is formed by the film forming method according to the second embodiment of the present invention, to a coated insulating film using the sample of FIG. 2C;

DESCRIPTION OF THE PREFERRED EMBODIMENTS

Embodiments of the present invention will be explained with reference to the accompanying drawings hereinafter.

(First Embodiment)

Figure 1:
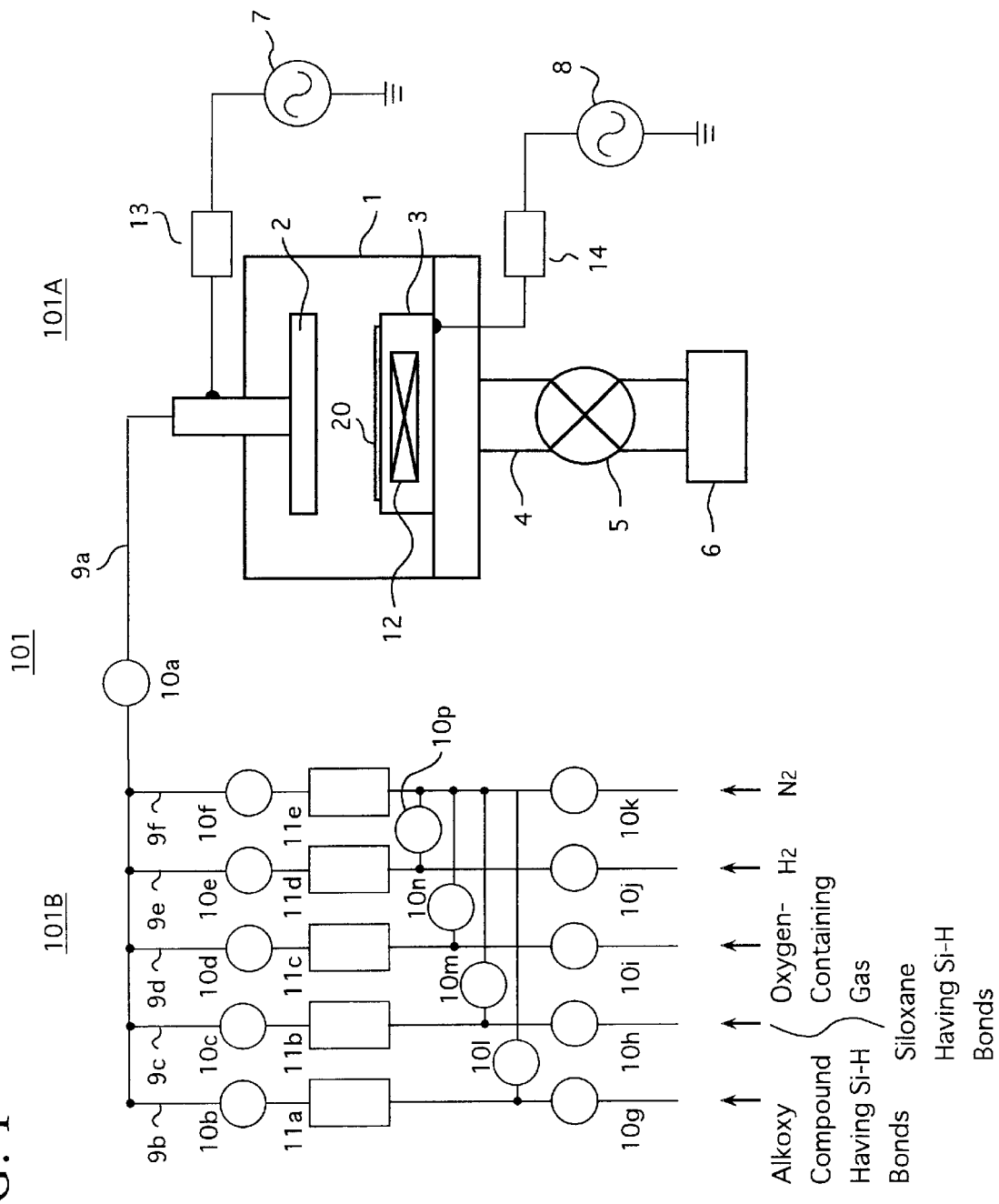
FIG. 1 is a side view showing a configuration of the plasma CVD film forming equipment employed in a film forming method according to a first embodiment of the present invention.

FIG. 1 is a side view showing a configuration of the parallel-plate type plasma CVD film forming equipment 101 employed in a film forming method according to an embodiment of the present invention.

This plasma CVD film forming equipment 101 comprises a film forming portion 101A that is the place at which a silicon-containing insulating film is formed by the plasma gas on a substrate 20, and a film forming gas supplying portion 101B having a plurality of gas supply sources constituting the film forming gas.

As shown in FIG. 1, the film forming portion 101A has a chamber 1 whose pressure can be reduced, and the chamber 1 is connected to an exhausting device 6 via an exhaust pipe 4. A switching valve 5 for controlling the open and the close between the chamber 1 and the exhausting device 6 is provided in the middle of the exhaust pipe 4. A pressure measuring means such as a. vacuum gauge (not shown) for monitoring the pressure in the chamber 1 is provided to the chamber 1.

A pair of opposing upper electrode (first electrode) 2 and lower electrode (second electrode) 3 are provided to the chamber 1. A high frequency power supply (RF power supply) 7 for supplying a high frequency power having a frequency of 13.56 MHz is connected to the upper electrode 2, while a low frequency power supply 8 for supplying a low frequency power having a frequency of 380 kHz is connected to the lower electrode 3. The film forming gas is plasmanized by supplying the power to the upper electrode 2 and the lower electrode 3 from these power supplies 7, 8. The upper electrode 2, the lower electrode 3, and the power supplies 7, 8 constitute the plasma generating means for plasmanizing the film forming gas.

As the plasma generating means, there are the means for generating the plasma by the first and second electrodes 2, 3 of the parallel-plate type, the means for generating the plasma by ECR (Electron Cyclotron Resonance) method, the means for generating the helicon plasma by irradiating the high frequency power from the antenna, etc., for example.

The upper electrode 2 is also used as a film forming gas distributor. A plurality of through holes are formed in the upper electrode 2, and opening portions of the through holes in the surface opposing to the lower electrode 3 serve as discharge ports (inlet ports) of the film forming gas. The discharge ports of the film forming gas, etc. are connected to the film forming gas supplying portion 101B via a pipe 9a. Also, a heater (not shown) may be provided to the upper electrode 2, as the case may be. This is because, if the upper electrode 2 is heated at the temperature of almost 100° C. during the film formation, particles made of reaction products of the film forming gas, etc. can be prevented from sticking onto the upper electrode 2.

The lower electrode 3 is also used as a loading table for the substrate 20. A heater 12 for heating the substrate 20 on the loading table is provided to the lower electrode 3.

In the film forming gas supplying portion 101B, a supply source for the alkoxy compound having Si—H bonds; a supply source for the siloxane having Si—H bonds; a supply source for any one oxygen-containing gas selected from a group consisting of oxygen ($O_2$), nitrogen monoxide ($N_2O$), nitrogen dioxide ($NO_2$), carbon monoxide (CO), carbon dioxide ($CO_2$), and water ($H_2O$); a supply source for the hydrogen ($H_2$); and a supply source for the nitrogen ($N_2$) are provided.

As for the alkoxy compound having Si—H bonds or the siloxane having Si—H bonds as the film forming gas to which the present invention is applied, followings may be employed as the typical examples.

(i) alkoxy compound having Si—H bonds trimethoxysilane (TMS: $SiH(OCH_3)_3$)

(ii) siloxane having Si—H bonds tetramethyldisiloxane (TMDSO: $(CH_3)_2HSi-O-SiH(CH_3)_2$)

These gases are supplied appropriately to the chamber 1 of the film forming portion 101A via branch pipes 9b to 9f and a pipe 9a to which all branch pipes 9b to 9f are connected. Flow rate controlling means 11a to lie and switching means 10b to 10k for controlling the open and the close of the branch pipes 9b to 9f are provided in the middle of the branch pipes 9b to 9f. A switching means 10a for controlling the open and the close of the pipe 9a is provided in the middle of the pipe 9a. Also, in order to purge the residual gas in the branch pipes 9b to 9e by flowing the $N_2$ gas, switching means 10l to 10n, 10p for controlling the open and the close between the branch pipe 9f, that is connected to the $N_2$ gas supply source, and remaining branch pipes 9b to 9e are provided. The $N_2$ gas purges the residual gas in the pipe 9a and the chamber 1 in addition to the branch pipes 9b to 9e.

According to the film forming equipment 101 described above, the supply source for supplying at least any one of the alkoxy compound having Si—H bonds and the siloxane having Si—H bonds and the oxygen-containing gas supply source are provided, and also the plasma generating means 2, 3, 7, 8 for plasmanizing the film forming gas are provided.

The insulating film containing Si, O, C, H can be formed by the plasma CVD method by using the above plasma CVD equipment. Therefore, as shown in a second embodiment described in the following, it is possible to form the insulating film that has the low dielectric constant, has the small amount of moisture content, is dense and is excellent in water resistance. Also, this insulating film has the good adhesiveness to the organic coating insulating film or the inorganic coating insulating film, and has the higher capability for preventing the diffusion of copper (Cu).

In particular, the power supplies 7, 8 for supplying the powers having two high and low frequencies to the first and second electrodes 2, 3 of parallel-plate type respectively are connected to them. Therefore, the plasma can be generated by applying the powers having these two high and low frequencies to the electrodes 2, 3 respectively. Thus, the insulating film formed in this manner is dense.

(Second Embodiment)

The examination, made by the inventors of the present invention, about the silicon-containing insulating film, that is formed by the above plasma CVD equipment, will be explained hereunder.

First, the well-known parallel-plate type plasma CVD equipment is employed as the above plasma CVD equipment. The lower electrode 3 of the upper and lower electrodes 2, 3 is also used as a substrate holder, and the heater 12 for heating the substrate is built in the lower electrode 3.

(Formation of Samples)

FIGS. 2A to 2E are sectional views showing samples having the silicon oxide film (a silicon-containing insulating film), of the present invention.

Figure 2A:
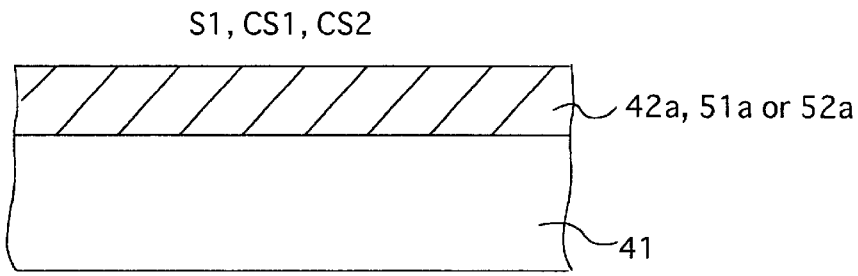
FIG. 2A to FIG. 2E are sectional views showing structures of samples employed to examine characteristics of a silicon-containing insulating film that is formed by the film forming method according to the first embodiment of the present invention, and structures of comparative samples.

As shown in FIG. 2A, a sample S1 has a silicon oxide film (this means a silicon-containing insulating film, and referred to as a "PE-CVD TMS $SiO_2$ film" hereinafter) 42a, that is formed by the PE-CVD method using the film forming gas containing trimethoxysilane (TMS) on a silicon substrate 41. For the sake of comparison, a comparative sample CS1 having a silicon oxide film (referred to as a "PE-CVD TEOS $SiO_2$ film" hereinafter) 51a, that is formed by the PE-CVD method using the film forming gas containing tetraethoxysilane (TEOS) on the silicon substrate 41, and a comparative sample CS2 having a silicon oxide film (referred to as a "PE-CVD $SiH_4$ $SiO_2$ film" hereinafter) 52a, that is formed by the PE-CVD method using the film forming gas containing monosilane ($SiH_4$) on the silicon substrate 41, are prepared.

Figure 2B:
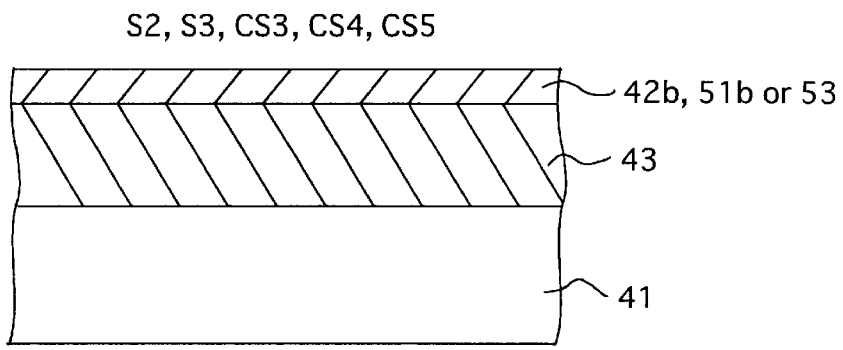
Figure 2C:
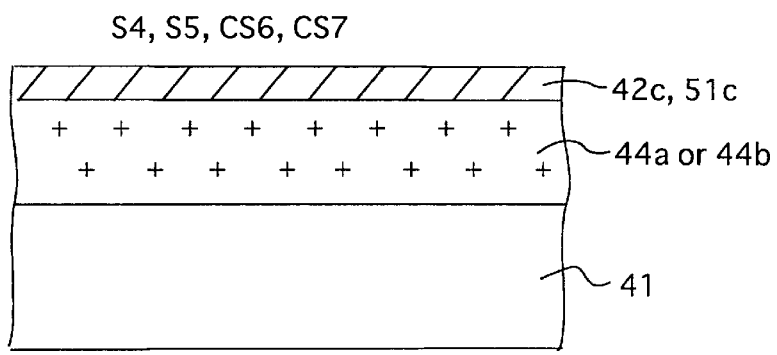
Figure 2D:
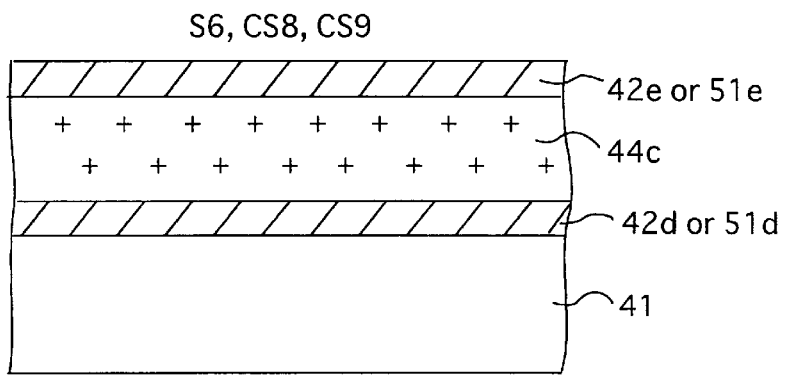
Figure 2E:
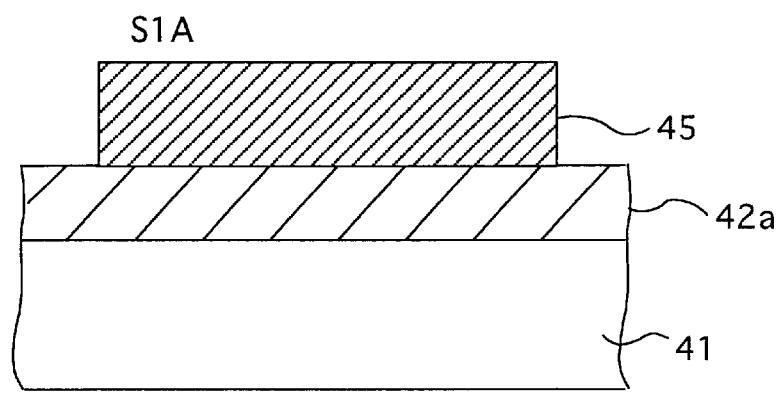

As shown in FIG. 2E, a sample S1A is formed by further forming an electrode 45 on the PE-CVD TMS $SiO_2$ film 42a, in the sample S1 in which the PE-CVD TMS $SiO_2$ film 42a is formed on the silicon substrate 41. The mercury probe is employed as the electrode 45, and a contact area between the mercury probe and the PE-CVD TMS $SiO_2$ film 42a is 0.0230 $cm^2$.

As shown in FIG. 2B, samples S2, S3 are formed by forming a BPSG film 43 having an amount of contained phosphorus of 7 mol % and a film thickness of about 500 nm and a PE-CVD TMS $SiO_2$ film 42b to be tested in sequence on the silicon substrate (Si substrate) 41. A film thickness of the PE-CVD TMS $SiO_2$ film 42b is set to 100 nm in the sample S2, and a film thickness of the PE-CVD TMS $SiO_2$ film 42b is set to 200 nm in the sample S3. For comparison, a comparative sample CS3 employing a PE-CVD TEOS $SiO_2$ film 51b having a film thickness of 200 nm in place of the PE-CVD TMS $SiO_2$ film 42b, a comparative sample CS4 employing a PE-CVD $SiH_4$ $SiO_2$ film 52b having a film thickness of 200 nm similarly, and a comparative sample CS5 employing a silicon nitride film (referred to as a "PE-CVD SiN film" hereinafter) 53, that is formed by the plasma CVD method using the film forming gas containing $SiH_4$, $NH_3$ and $N_2$ similarly to have a film thickness of 200 nm, are prepared.

As shown in FIG. 2C, samples S4, S5 are formed by forming low dielectric constant insulating films 44a, 44b and a PE-CVD TMS $SiO_2$ film 42c in sequence on the silicon substrate (Si substrate) 41. An inorganic coating insulating film 44a is employed as the low dielectric constant insulating film in the sample S4, and an organic coating insulating film 44b is employed similarly in the sample S5. For comparison, comparative samples CS6, CS7 employing a PE-CVD TEOS $SiO_2$ film 51c in place of the PE-CVD TMS $SiO_2$ film 42c are formed. The inorganic coating insulating film 44a is employed as the low dielectric constant insulating film in the comparative sample CS6, and the organic coating insulating film 44b is employed similarly in the comparative sample CS7.

The inorganic coating insulating film is such an insulating film that is formed by coating the coating liquid such as HSQ (product name: manufactured by Dow Corning Co., Ltd.), MSQ (product name), R7 (product name: Hitachi Chemical Co., Ltd.), etc. The compound having one carbon or less is distinctively contained as the component compound in the coating liquid. The organic coating insulating film is formed by coating the coating liquid such as FLARE (product name: manufactured by Allied Signal Co., Ltd.), SiLK (product name: manufactured by The Dow Chemical Co.), etc. The compound having two carbons or more is distinctively contained as the component compound in the coating liquid.

As shown in FIG. 2D, a sample S6 is formed by forming a PE-CVD TMS $SiO_2$ film (lower protection layer) 42d having a film thickness of about 150 nm, a coating insulating film (main insulating film) 44c having a film thickness of about 200 nm, and a PE-CVD TMS $SiO_2$ film (upper protection layer) 42e having a film thickness of about 200 nm in sequence on the silicon substrate 41. The coating insulating film 44c is formed by spin-coating the coating liquid (FOx (product name)), that is produced by dissolving HSQ (Hydrogen silsesquioxane) into the solvent, then baking the coated liquid at the temperature of 150, 200, and 350° C. for one minute in the nitrogen respectively, and then curling the resultant at the temperature of 400° C. for 50 minutes in the nitrogen. For comparison, a comparative sample CS8 in which a PE-CVD TEOS $SiO_2$ film 51d is formed in place of the PE-CVD TMS $SiO_2$ film 42d as the lower protection layer and a comparative sample CS9 in which PE-CVD TEOS $SiO_2$ films 51d, 51e are formed in place of the PE-CVD TMS $SiO_2$ films 42d, 42e as the upper and lower protection layers are prepared.

The PE-CVD TMS $SiO_2$ films 42a to 42e of the samples S1 to S6 are formed by using the above plasma CVD equipment under following film forming conditions.

Film forming gas: TMS+$N_2O$
   TMS gas flow rate: 100 sccm
   $N_2O$ gas flow rate: 3000 sccm
   Gas pressure: 0.7 Torr
Plasmanizing conditions
   Power density applied to the upper electrode 2: 0.3 W/$cm^2$
   (frequency 13.56 MHz)
   Power density applied to the lower electrode 3: 0.3 W/$cm^2$
   (frequency 380 kHz)

In this film-forming apparatus, these power densities correspond to the applied powers 750W to the electrodes, respectively.

Substrate temperature: 300 to 400° C.
Film forming thickness: t nm

The above plasma CVD apparatus 101 is also employed for forming the PE-CVD TEOS $SiO_2$ film 51a of the comparative sample CS1, the PE-CVD $SiH_4$ $SiO_2$ film 52a of the comparative sample CS2, the PE-CVD TEOS $SiO_2$ films 51b to 51e of the comparative samples CS3, CS4, CS6 to CS9, the PE-CVD SiN film 53 of the comparative sample CS5.

Following characteristics of the PE-CVD TMS SiO$_2$ film 42a to 42e formed as above are examined.

(i) Basic characteristic

The film forming rate of the above film forming conditions is at the range of about 160 to 170 nm/min.

Also, the refractive index of the formed PE-CVD TMS SiO$_2$ film is at the range of 1.477 to 1.48, and the film stress is −250 Mpa or 3.0×10$^9$ dyne/cm$^2$. The ellipsometer using the He-Ne laser having a wavelength of 6338 angstrom is employed to measure the refractive index. Also, the opti-lever laser scanning system is employed to measure the film stress.

Also, the film thickness (t) is 500 nm, and the relative dielectric constant of the PE-CVD TMS SiO$_2$ film is 3.9. The sample C1A is employed as a sample to examine the relative dielectric constant.

The relative dielectric constant is calculated based on the result that is obtained by superposing a small signal having a frequency of 1 MHz onto the DC voltage (V) applied between the Si substrate 41 and the electrode 45 in the examined sample S1A, and then measuring the change: in a capacitance (C) in response to the change in the DC voltage (V).

(ii) Concentration of Carbon and Nitrogen in the film

A concentration of carbon and nitrogen in the PE-CVD TMS SiO$_2$ film 42a is measured by the auger electron spectroscopy method (AES method) using the sample S1.

According to the measuring results, the concentration of carbon is 1.0 atoms%, and the concentration of carbon is 2.1 atoms%.

(iii) Film density

The film density of the PE-CVD TMS SiO$_2$ film 42a is examined employing the sample S1 by the well-known X-ray interference method or weight measuring method.

By way of comparison, similar examinations are carried out to the thermal SiO$_2$ film, the comparative sample CS1 of the PE-CVD TEQS SiO$_2$ film 51a, and the comparative sample CS2 of the PE-CVD SiH$_4$ SiO$_2$ film 52a in place of the PE-CVD TMS SiO$_2$ film 42a.

As shown in FIGS. 3A and 3B, it is found that the PE-CVD TMS SiO$_2$ film 42a has the high film density of 2.33 rather than other insulating films and is dense.

(iv) Amount of contained moisture in the film

An amount of contained moisture in both the film that is obtained immediately after the formation (as deposited) and the film that is left for two weeks in the air is measured employing the sample S1 by the TDS (Thermal Desorption Mass Spectroscopy) method. This TDS method is the way of heating the sample and then measuring the molecules emitted from the sample. For the sake of comparison, the similar examination is carried out to the comparative sample CS1 employing the PE-CVD TEOS SiO$_2$ film 51a.

The examination is carried out by heating the sample from the room temperature to 800° C. by the TDS analysis equipment and then quantitating the amount of moisture extracted from the sample.

Figure 4:
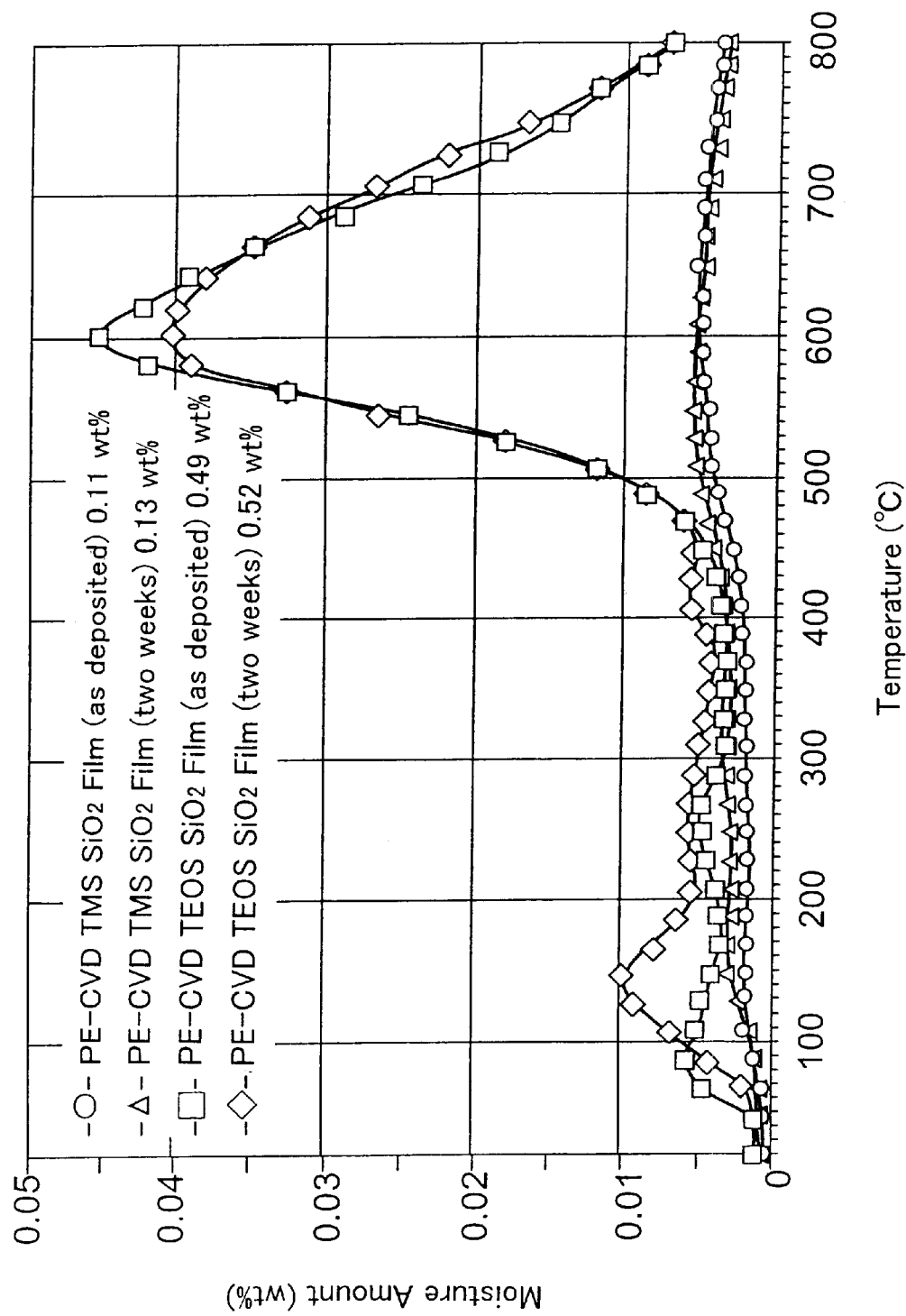
FIG. 4 is a graph showing examined results of a moisture content and a water resistance of the silicon-containing insulating film that is formed by the film forming method according to a second embodiment of the present invention using the sample of FIG. 2A.

FIG. 4 is a graph showing the examined results. In FIG. 4, an ordinate denotes the amount of moisture (wt %) represented in a linear scale and an abscissa denotes the temperature (° C.) represented in a linear scale.

According to the measurement executed immediately after the film formation (as deposited), when the temperature is risen from the room temperature to 800° C., the amount of moisture in the PE-CVD TMS0 SiO$_2$ film 42a is 0.11 wt % whereas the amount of moisture in the PE-CVD TEOS SiO$_2$ film 51a is 0.49 wt %. In addition, according to the measurement executed two weeks later, the amount of moisture in the PE-CVD TMS SiO$_2$ film 42a is increased merely by +0.2 to 0.3 wt % and thus the amount of moisture is seldom varied.

As described above, it is found that both the structural water (the moisture contained in the film due to the film forming gas and the film structure immediately after the film formation) and the physical adsorption water (the incoming moisture that is adsorbed and absorbed physically) in the PE-CVD TMS SiO$_2$ film 42a are small in contrast to the PE-CVD TEOS SiO$_2$ film 51a.

(v) FT-IR Absorption Intensity

Figure 5A:
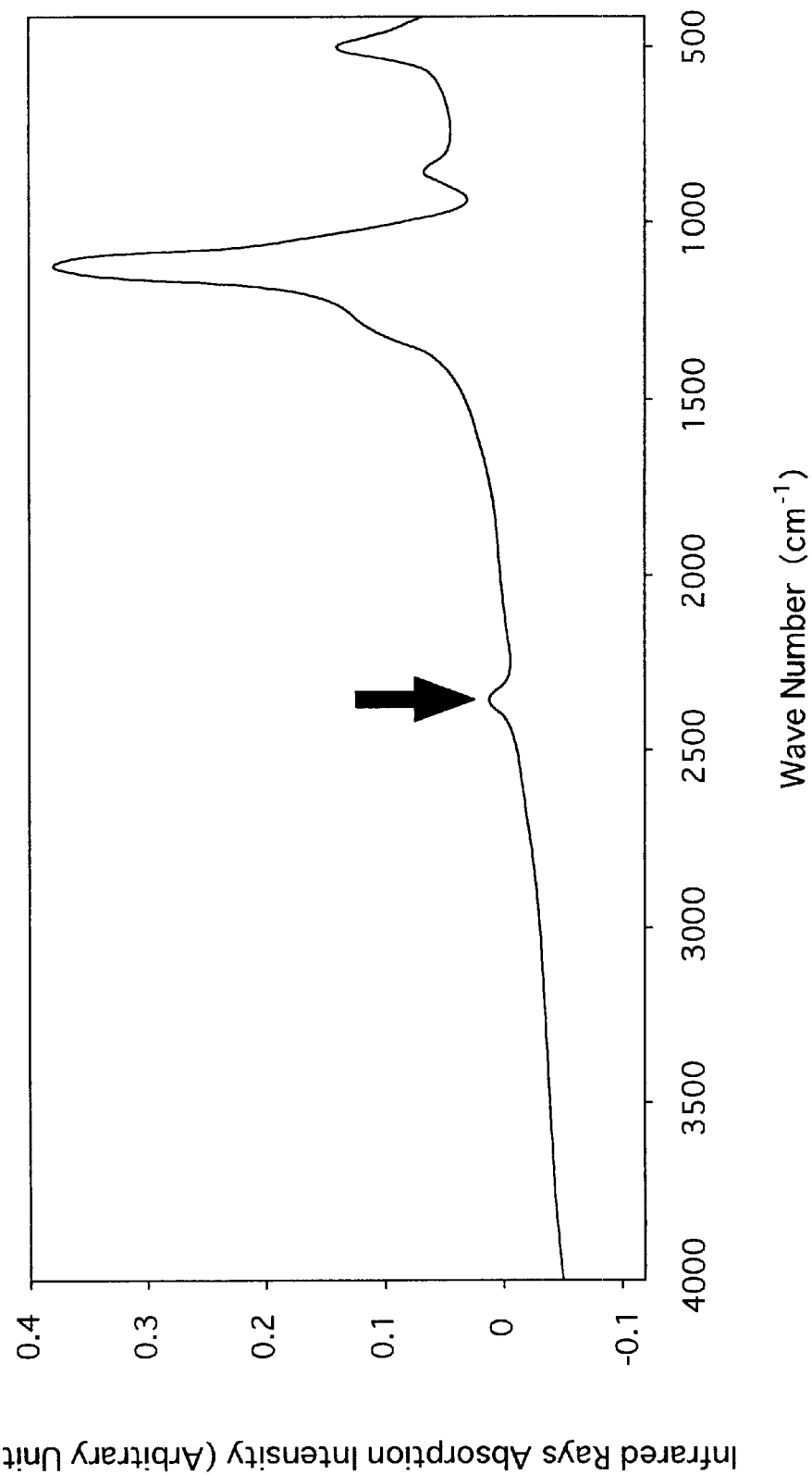
FIG. 5A is a graph showing examined results of an infrared absorption intensity of the silicon-containing insulating film that is formed by the film forming method according to a second embodiment of the present invention using the sample of FIG. 2A.

Then, examined results of the infrared rays absorption intensity in the sample S1 by the FT-IR analysis method (Fourier Transform Infrared analysis method) are shown in FIG. 5A. Similarly, examined results in the comparative samples CS1, CS2 are shown in FIG. 5B.

An ordinate of FIG. 5A denotes the absorption intensity expressed in a linear scale (arbitrary unit), and an abscissa denotes the wave number expressed in a linear scale (cm$^{-1}$). Similarly, this is true of FIG. 5B.

As shown in FIG. 5A, the peak of the infrared rays absorption intensity having a center wave number in a range of 2270 to 2350 cm$^{-1}$ is confirmed. In contrast, as shown in FIG. 5B, such peak is not watched in the comparative samples CS1, CS2.

(vi) Water Resistance

The water resistance of the PE-CVD TMS SiO$_2$ film 42b is exampled by the high pressure humidifying test (pressure-cooker test) while using the samples S2, S3 shown in FIG. 2B. By way of comparison, the similar examination is applied to the comparative sample CS3 employing the PE-CVD TEOS SiO$_2$ film 51b in place of the PE-CVD TMS SiO$_2$ film 42b and the comparative sample CS5 employing the PE-CVD SiN film 53 similarly.

The conditions of the high pressure humidifying test are given as follows. The leaving time is used as a parameter.

Temperature: 121° C.

Pressure: 2.0 atm

Humidity: 100% R. T. (Room Temperature)

Evaluation of the water resistance is carried out by evaluating an amount of P=O bonds contained in the examined insulating film after the high pressure humidifying test. In order to evaluate the amount of P=O bonds contained in the BPSG film 43, the P=O absorption coefficient is measured by the FT-IR analysis method. If the moisture enters into the BPSG film 43, the P=O bonds in the film react with the moisture to destroy. In this case, if the PE-CVD TMS SiO$_2$ film 42b for covering the BPSG film 43 has the high water resistance, such film does not pass through the moisture and thus the P=O bonds in the BPSG film 43 are never destroyed. As a result, it is possible to say that, if the time dependent change of the P=O absorption coefficient becomes smaller, the water resistance becomes higher.

Figure 6:
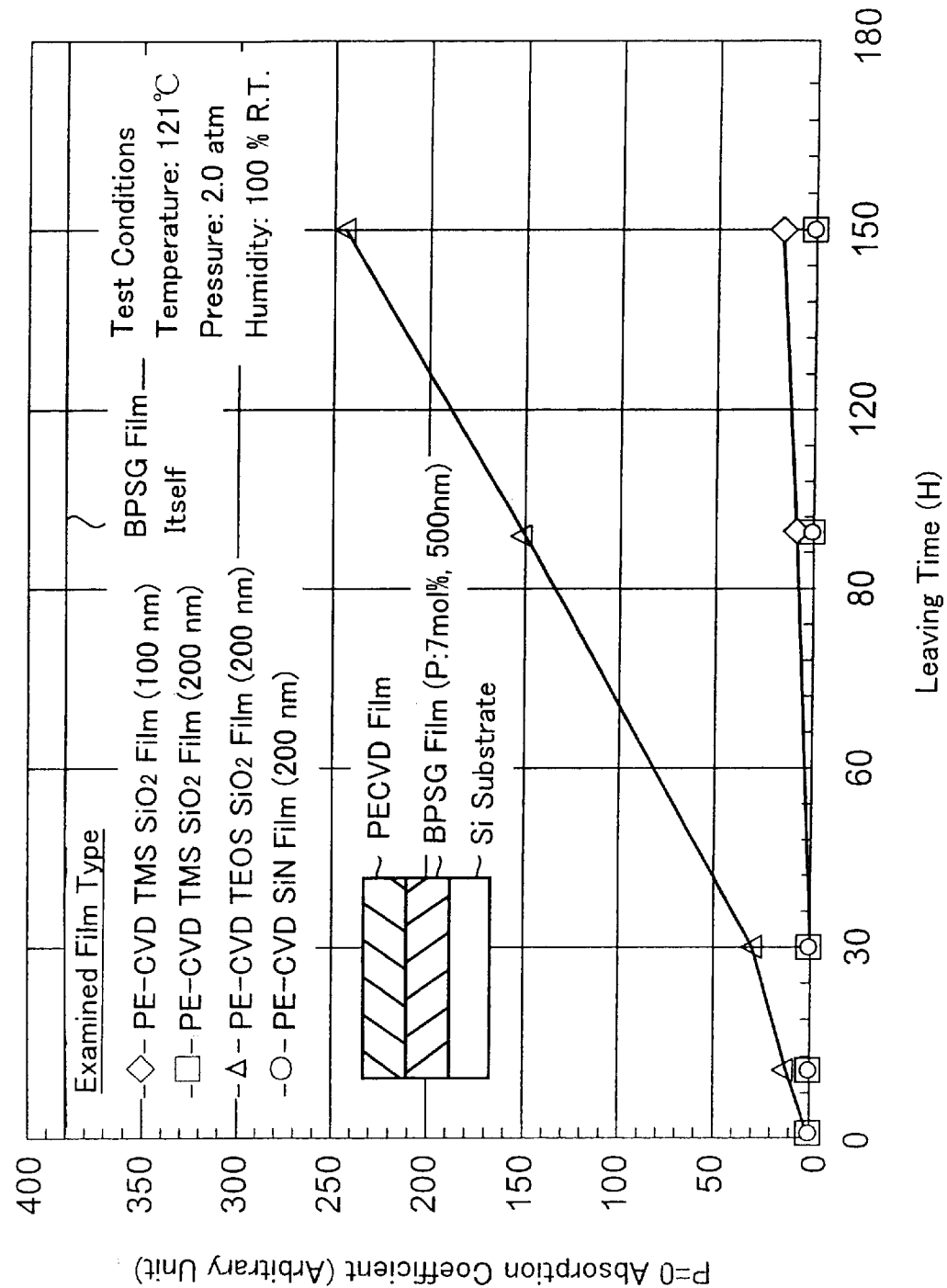
FIG. 6 is a graph showing examined results of a water resistance of the silicon-containing insulating film that is formed by the film forming method according to a second embodiment of the present invention using the sample of FIG. 2B.

FIG. 6 is a graph showing the time dependent change of an amount of contained phosphorus in the insulating film after the high pressure humidifying test is carried out. An ordinate denotes the P=O absorption coefficient (arbitrary unit) expressed in a linear scale, and an abscissa denotes the leaving time (H (hour)) expressed in a linear scale.

Based on the results shown in FIG. 6, it is found that, even after both the samples S2, S3 are left for 150 hours as they are, their P=O absorption coefficients are seldom changed from the initial P=O absorption coefficient regardless of the magnitude of the thickness of the PE-CVD TMS SiO$_2$ film 42b, like the PE-CVD SiN film 53 in the comparative sample CS5, i.e., the PE-CVD TMS SiO$_2$ film 42b has the water resistance equivalent to the PE-CVD SiN film 53.

Also, the water resistance is examined by another high pressure humidifying test while using the examined sample S3 and the comparative samples CS3, CS4.

The conditions of the high pressure humidifying test are the same as above.

Figure 7:
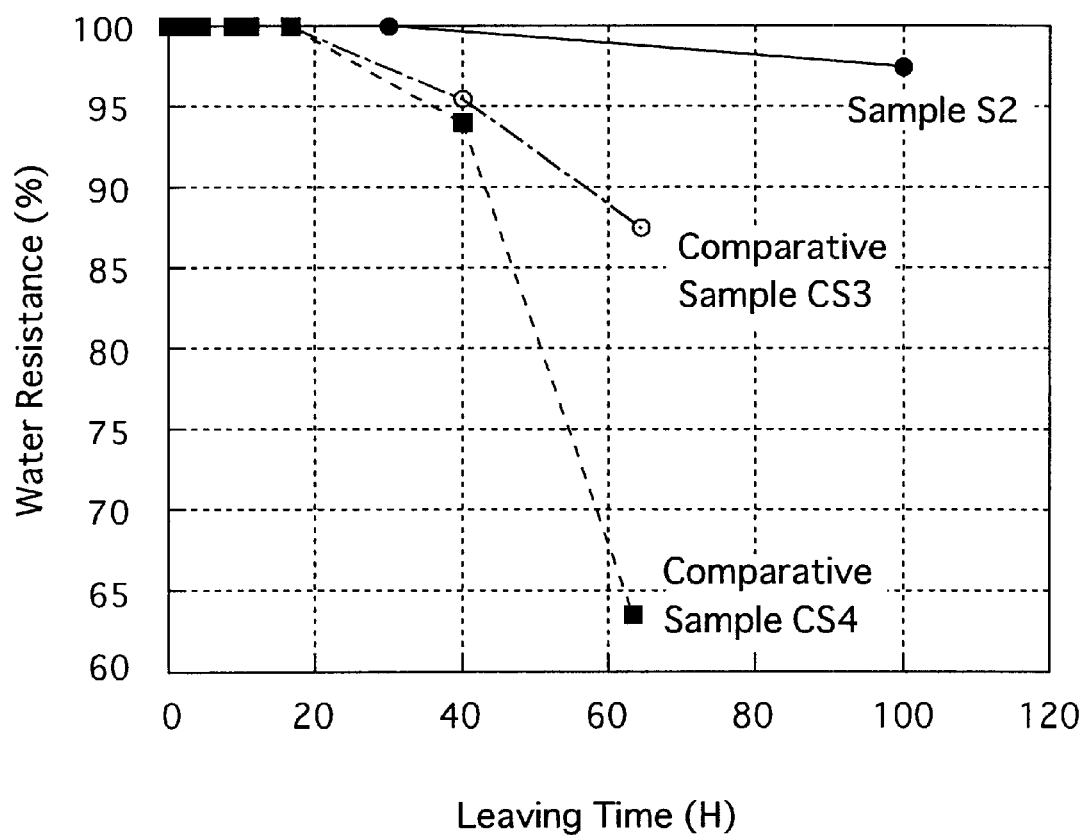
FIG. 7 is a graph showing examined results of a water resistance due to a pressure-cooker test of the silicon-containing insulating film that is formed by the film forming method according to a second embodiment of the present invention using the sample of FIG. 2B.

The results are shown in FIG. 7. An ordinate of FIG. 7 denotes the water resistance (%) expressed in a linear scale, and an abscissa denotes the leaving time (H (hour)) expressed in a linear scale. The sample S3 and the comparative samples CS3, CS4 are used as a parameter.

Like the above, the evaluation of the water resistance is carried out by evaluating an amount of P=O bonds contained in the examined insulating film after the high pressure humidifying test. The water resistance in FIG. 7 is derived by calculating the P=O absorption coefficient obtained after the high pressure humidifying test on the basis of the P=O absorption coefficient before the leaving-off, that is assumed as 100.

As shown in FIG. 7, it is found that the sample S3 has the water resistance of 97.4 % (100 H), that exceeds the comparative samples CS3, CS4.

(vii) Leakage current of the film

The examined sample S1A shown in FIG. 2E is formed. That is, the electrode 45 is formed on the PE-CVD TMS $SiO_2$ film 42 having a film thickness (t) of 200 nm in the sample S1 according to the present invention.

The leakage current flowing through the silicon substrate 41 and the electrode 45 is measured by applying the voltage between the silicon substrate 41 and the electrode 45. The silicon substrate 41 is grounded, and the negative voltage is applied to the electrode 45.

According to the results, the leakage current of the PE-CVD TMS $SiO_2$ film 42a as the single substance is on the order of $10^{-8}$ $A/cm^2$ at the electric field strength of 5 MV/cm, and the breakdown voltage is about 10 MV/cm in terms of the electric field.

In this manner, since the insulating film itself of the present invention has essentially the small leakage current like the silicon nitride film, the introduction of the oxygen is not needed to reduce the leakage current, unlike the insulating film containing Si and C. As a result, there is no possibility that the surface of the copper film is oxidized by the introduction of oxygen or the oxygen introducing process and thus the barrier insulating film that comes into contact with the copper film is ready to peel off.

(viii) Adhesiveness of the film

The adhesiveness between the PE-CVD TMS $SiO_2$ film 42c according to the present invention and the underlying low dielectric constant insulating film 44a, 44b is examined employing the samples S4, S5. Also, the sample which is subjected to the surface treatment prior to the film formation and the sample which is not subjected to the surface treatment are prepared, and then the similar examination is carried out. The surface treatment executed prior to the film formation is the treatment for reforming the surface of the processed film by employing the plasma of $N_2$, $NH_3$, $H_2$, etc.

By way of comparison, the PE-CVD TEOS $SiO_2$ film 51c is employed in place of the PE-CVD TMS $SiO_2$ film 42c, and similar examinations are carried out employing the inorganic coating insulating film 44a (the comparative sample CS6) and the organic coating insulating film 44b (the comparative sample CS7) as the low dielectric constant insulating film.

As the test for examining the adhesiveness of the film, the peel test by using the tape and the peel test by the CMP (Chemical Mechanical Polishing) on the entire surface of the wafer are carried out.

According to the examined results, regardless of the presence of the surface treatment prior to the film formation, the PE-CVD TMS $SiO_2$ film 42c has the good adhesiveness to the inorganic coating insulating film 44a and the organic coating insulating film 44b. In contrast, a degree of the adhesiveness of the PE-CVD TEOS $SiO_2$ film 51c is inferior to the PE-CVD TMS $SiO_2$ film 42c as a whole. Then, difference in the adhesiveness appeared in response to whether or not the surface treatment is applied prior to the film formation. That is, the sample which is subjected to the surface treatment prior to the film formation had the higher adhesiveness than the sample which is not subjected to the surface treatment.

(ix) Defect Generating Rate due to Heat Cycle

The defect generating rate due to the heat cycle about the sample S6 and the comparative samples CS8, CS9 is examined. Respective samples are sealed in the package. Test conditions of the heat cycle are given as follows. The cycle number is used as a parameter.

Figure 9:
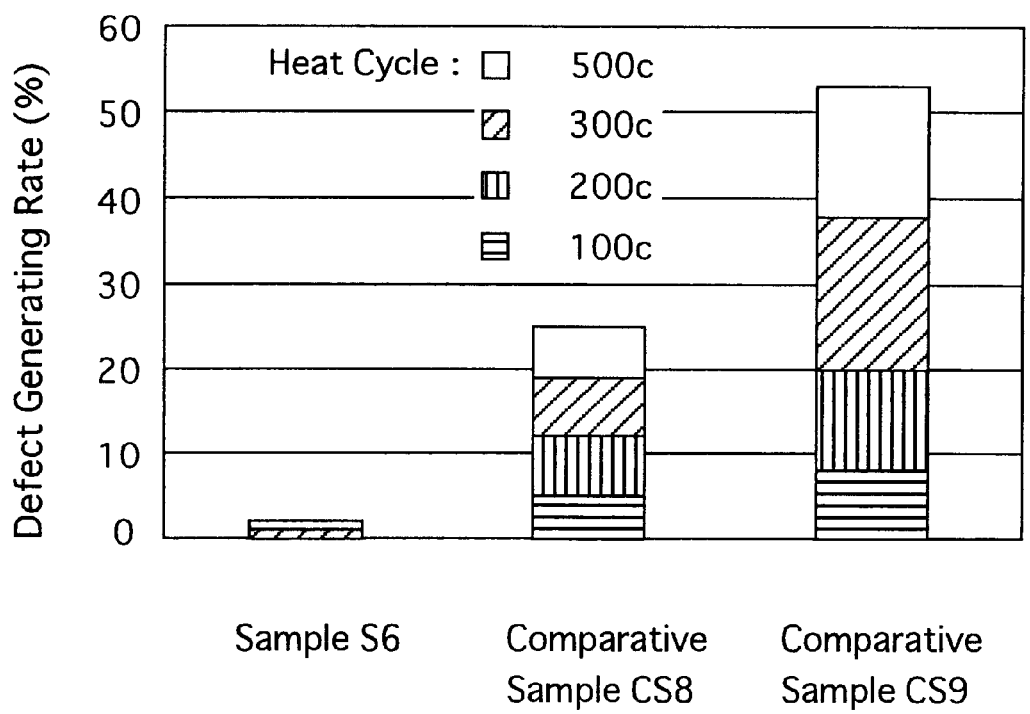
FIG. 9 is a graph showing examined results of a defect generating rate due to a heat cycle using the sample of FIG. 2D according to the second embodiment of the present invention.

High temperature (holding time): 150° C. (20 minutes)
Low temperature (holding time): −55° C. (20 minutes)
Cycle number: 100, 200, 300, 500 C The results are shown in FIG. 9. An ordinate of FIG. 9 denotes the defect generating rate (%) expressed in a linear scale, and an abscissa denotes the types of the sample. The types of the sample are the sample S6, and the comparative samples CS8, CS9, as explained above, in order from the left side. The partition area indicated by a bar graph denotes a fraction defective at a particular cycle number, the partition area hatched by lateral lines denotes the fraction defective at 100° C., the partition area hatched by vertical lines denotes the fraction defective at 200° C., the partition area hatched by oblique lines denotes the fraction defective at 300° C., and the white partition area on a black ground denotes the fraction defective at 500° C.

As shown in FIG. 9, in the sample S6 employing the silicon oxide film of the present invention as both the upper protection layer and the lower protection layer, the defect is generated at 300° C. or more, but the defect generating rate is about 2 to 3% even if the defect generating rates at 300° C. and 500° C. are added. In the comparative sample CS8 employing the silicon oxide film 52d of the present invention only as the lower protection layer out of the upper protection layer and the lower protection layer, the defect is generated almost uniformly from 100° C. to 500° C., and the defect generating rate is about 25% in total. In the comparative sample CS9 not employing the silicon oxide film 42d, 42e of the present invention as both the upper protection layer and the lower protection layer, the defect is generated from 100° C. to 500° C. In particular, the defect generating rate at 300° C. and 500° C. are increased, and the defect generating rate is about 53% in total.

(x) Examination of the barrier characteristic to the copper (Cu)

(a) TDDB (Time Dependent Dielectric Breakdown) test

The TDDB test measures a time required to come up to the dielectric breakdown when the voltage is applied to the sample.

The examined sample is prepared by stacking the PE-CVD TMS $SiO_2$ film according to the present invention and the Cu film on the Si substrate in sequence. By way of comparison, the similar examination is applied to the sample employing the PE-CVD TEOS $SiO_2$ film in place of the PE-CVD TMS $SiO_2$ film, and the sample interposing the TiN film between the Cu film and the PE-CVD TEOS $SiO_2$ film.

According to the examined results, the breakdown lifetime of $10 \times 10^5$ seconds is obtained at the electric field strength of 8 MV/cm.

In contrast, in the sample employing the PE-CVD TEOS SiO$_2$ film, the electric field strength is 8 MV/cm to get the breakdown lifetime on the order of 10×10$^5$ seconds. This means that the breakdown lifetime of the sample employing the PE-CVD TMS SiO$_2$ film is longer by almost six figures than the sample employing the PE-CVD TEOS Si0$_2$ film.

In the sample interposing the TiN film between the Cu film and the PE-CVD TEOS SiO$_2$ film, the electric field strength is 7.5 MV/cm to get the breakdown lifetime on the order of 10×10$^5$ seconds.

With the above, it is possible to say that the sample employing the PE-CVD TMS SiO$_2$ film has the longer breakdown lifetime by almost six figures than the sample employing the PE-CVD TEOS SiO$_2$ film and has the barrier characteristic to Cu, that is equivalent to or more than the TiN film.

(b) Examination of heat resistance

Figure 10:
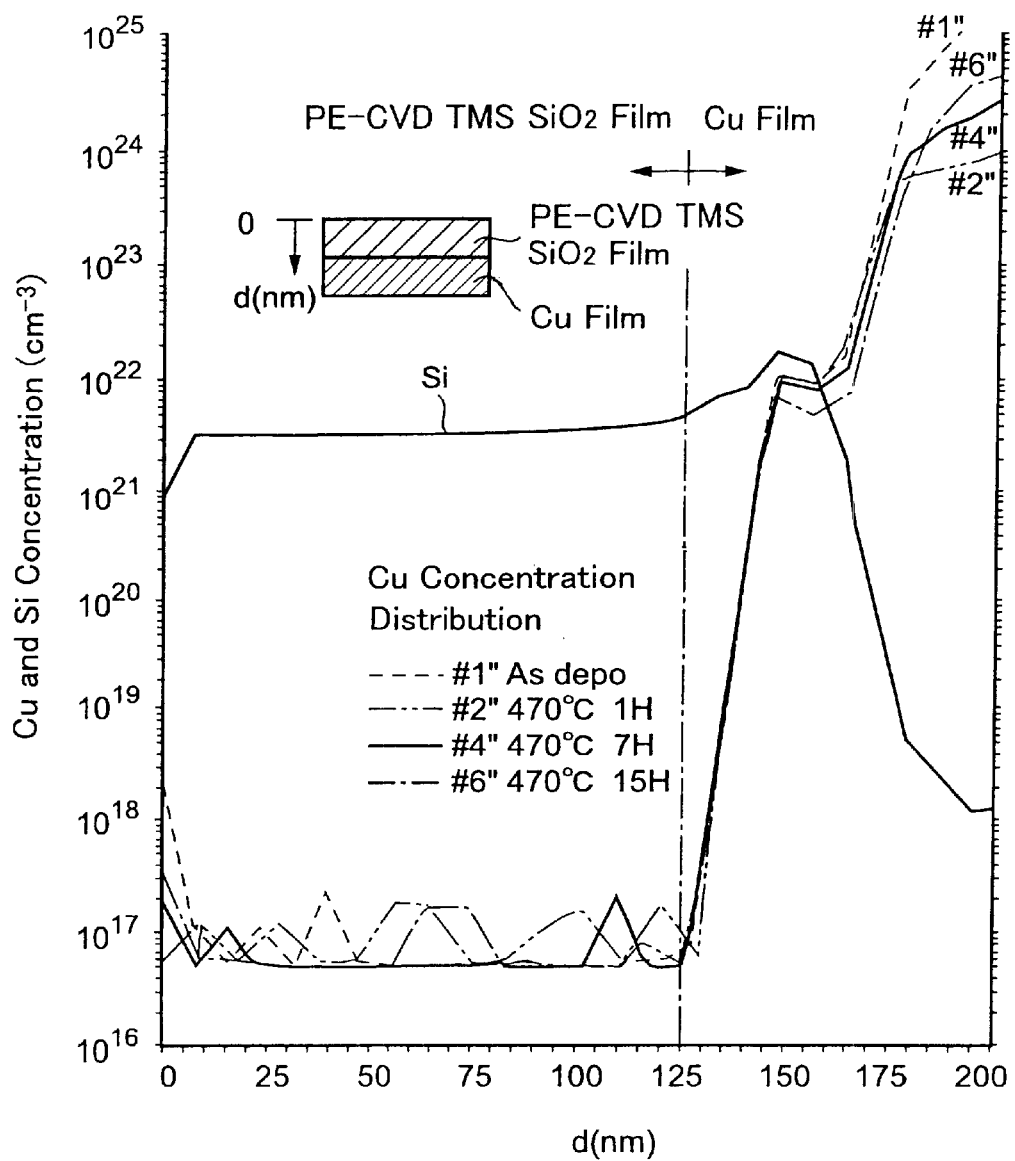
FIG. 10 is a graph showing examined results of a barrier characteristic to a copper of the silicon-containing insulating film that is formed by the film forming method according to the second embodiment of the present invention.

As shown in FIG. 10, the examined sample is prepared by stacking the PE-CVD TMS SiO$_2$ film of 125 nm thickness according to the present invention and the Cu film on the Si substrate (not shown) to contact to each other.

The examination is made by measuring the Cu concentration distribution state in the PE-CVD TMS SiO$_2$ film on the basis of the state obtained immediately after the film formation (indicated by a dotted line in FIG. 10) after the sample is processed for a predetermined time (three types, i.e., 1 hour (chain double-dashed line), 7 hours (solid line), and 15 hours (dot-dash line)) at the temperature of 470° C.

FIG. 10 is a graph showing the examined results. In FIG. 10, an ordinate on the left side denotes a Cu concentration and a Si concentration (cm$^{-3}$) represented in a logarithmic scale. An abscissa denotes a depth (nm) measured from one surface of the PE-CVD TMS SiO$_2$ film toward the Cu film side and represented in a linear scale.

As shown in FIG. 10, the distribution is seldom changed from the distribution obtained immediately after the film formation. In other words, it is found that the PE-CVD TMS SiO$_2$ film has the sufficient barrier characteristic to the Cu.

In the above, the alkoxy compound (ex. TMS) having Si—H bonds is employed as the silicon-containing gas in the film forming gas. But the siloxane having Si—H bonds may be employed.

Also, N$_2$O is employed as the oxygen-containing gas in the above. But any one selected from the group consisting of oxygen (O$_2$), nitrogen dioxide (NO$_2$), carbon monoxide (CO), carbon dioxide (CO$_2$) and water (H$_2$O) may be employed.

In addition, if any one selected from the group consisting of hydrogen (H$_2$) and nitrogen (N$_2$) is added to the above film forming gas, the density can be further enhanced.

(Third Embodiment)

Next, a semiconductor device manufacturing method according to a third embodiment of the present invention will be explained with reference to FIGS. 11A and 11B hereunder.

Figure 11A:
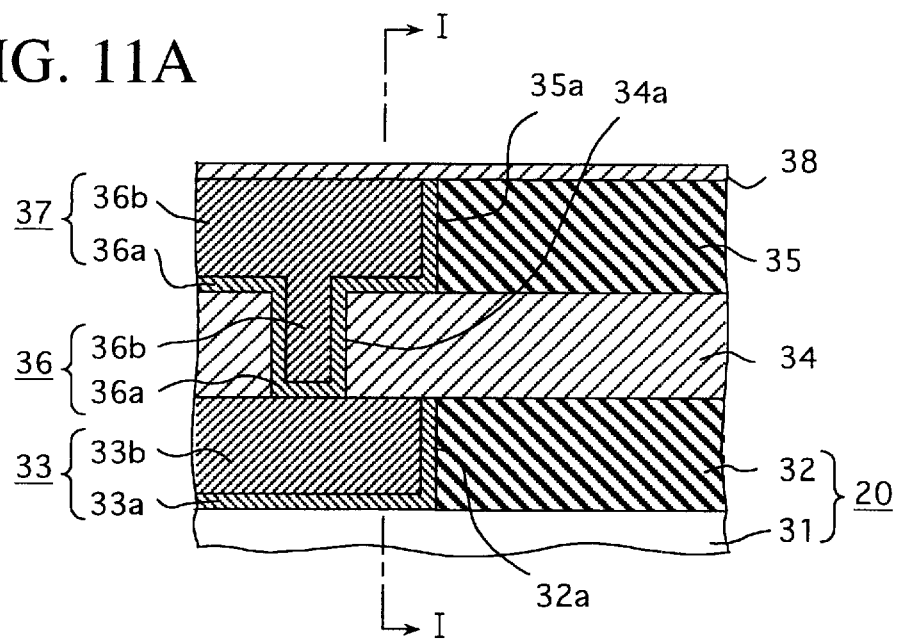
FIGS. 11A and 11B are sectional views showing a semiconductor device manufacturing method according to a third embodiment of the present invention.
Figure 11B:
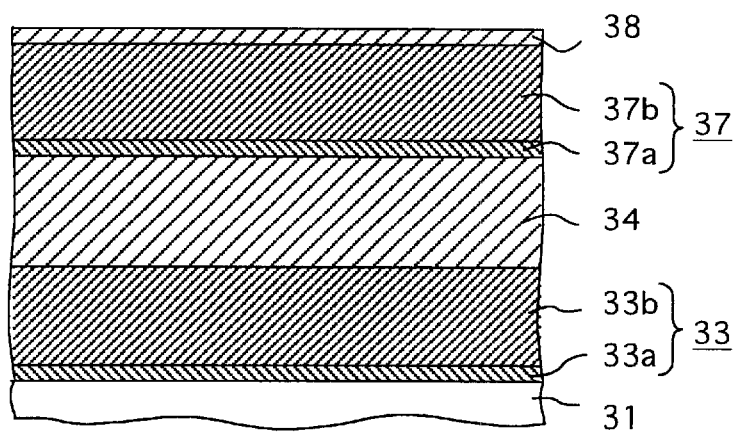

FIG. 11A is a sectional view showing a semiconductor device according to the third embodiment of the present invention. FIG. 11B is a sectional view taken along a I—I line in FIG. 11A.

This semiconductor device is formed of a lower wiring buried insulating film 32 made of an SiOF film with a thickness of approximately 1 m on a base substrate 31. a lower wiring recess 32a is formed in the lower wiring buried insulating film 32 and a lower wiring 33 is buried therein. Moreover, an inter-wiring layer insulating film (a protection layer) 34 made of a PE-CVD TMS SiO$_2$ film (a silicon-containing insulating film) with a thickness of approximately 10 nm according to the present invention, and a upper wiring buried insulating film 35 made of an SiOF film with a thickness of approximately 1 m are laminated in this order. The PE-CVD TMS SiO$_2$ film according to the present invention has a peak of an absorption intensity of an infrared rays in a range of a wave number 2270 to 2350 cm$^{-1}$, a film density in a range of 2.25 to 2.40 g/cm$^3$, and a relative dielectric constant in a range of 3.3 to 4.3.

A via-hole 34a is formed in the inter-wiring layer insulating film 34, and an upper wiring recess 35a is formed in the upper wiring buried insulating film 35. The upper wiring recess 35a has a larger opening area than the via-hole 34a, and communicates with the via-hole 34a.

A TaN (a copper diffusion preventing film) 36a and a copper film 36b are buried in the via-hole 34a and the upper wiring recess 35a by the well-known called dual damascene method buries to integrally form a connecting conductor 36 and an upper wiring 37. An entire upper most surface thereof is covered with an upper most protection film 38 made of a PE-CVD TMS SiO$_2$ film according to the present invention.

According to the aforementioned experiment by the inventor of the present application, the PE-CVD TMS SiO$_2$ film having the aforementioned characteristics has a high mechanical strength, is dense, has a high water resistance, and has a small content of moisture similarly to a silicon nitride film, and is a lower relative dielectric constant than the silicon nitride.

According to the embodiment, the inter-wiring layer insulating film 34 made of the PE-CVD TMS SiO$_2$ film having the aforementioned characteristics is formed so as to cover the copper film 33b of the upper wiring 33 while contacting the copper film 33b. The upper most protection layer 38 is formed so as to cover the copper film 36b of the upper wiring 37 while contacting the copper film 36b.

Accordingly, the semiconductor device keeps the relative dielectric constant lower, while it can prevent the copper from diffusing from the lower wiring 33 and the upper wiring 37 to a periphery thereof without a barrier insulating film such as a silicon nitride.

Further, the lower wiring buried insulating film 32 is covered with the inter-wiring layer insulating film 34, and the upper wiring buried insulating film 35 is covered in both a lower surface and an upper surface thereof with the inter-wiring layer insulating film 34 and the upper most protection layer 38. Accordingly, a penetration of an incoming moisture to the wiring buried insulating film 32, 35 can be blocked, so that a relative dielectric constant of the wiring buried insulating film 32, 35 can be prevented from changing due to absorption of moisture.

Moreover, since the lower wiring 33 is covered with the inter-wiring layer insulating film 34 and the upper wiring 37 is covered with the upper most protection layer 38, a corrosion of the wirings 33, 37 can be prevented.

Next, the manufacturing method for the aforementioned semiconductor device will be described. TMS+N$_2$O is employed as the film forming gas for an inter-wiring layer insulating film 34 that is put between a lower wiring-buried insulating film 32 into which a lower wiring 33 is buried and an upper wiring-buried insulating film 35 into which an upper wiring 37 is buried.

First, as shown in FIG. 11A, the wiring-buried insulating film 32 formed of an SiOF film having a film thickness of about 1 $\mu$m is formed on a silicon substrate (substrate) 31. Then, a wiring recess 32a is formed by etching the wiring-buried insulating film 32, and then a TaN film 33a is formed as a copper diffusion preventing film on an inner surface of the wiring recess 32a. Then, a copper seed layer (not shown)

is formed on a surface of the TaN film 33a by the sputter method, and then a copper film is buried therein by the plating method. The copper film 33b and the TaN film 33a, both are projected from the wiring recess, are polished by the CMP (Chemical Mechanical Polishing) method to planarize its surface. Accordingly, the lower wiring 33 consisting of the copper wiring 33b and the TaN film 33a is formed. These elements constitute a substrate 20.

Then, the inter-wiring layer insulating film 34 made of the PE-CVD TMS $SiO_2$ film having a film thickness of several tens nm is formed by the plasma CVD method using TMS+$N_2O$. The details thereof will be explained hereunder.

That is, in order to form the PE-CVD TMS $SiO_2$ film, first the substrate 20 is loaded into the chamber 1 of the plasma film forming equipment 101, and then held by the substrate holder 3. Then, the substrate 20 is heated to be held at the temperature of 350° C. TMS and the $N_2O$ gas are introduced into the chamber 1 of the plasma film forming equipment 101 shown in FIG. 1 at flow rates of 100 sccm and 3000 sccm respectively to hold the pressure at 0.7 Torr. Then, the power 0.3 W/cm$^2$ having the frequency of 380 kHz is applied to the lower electrode 3, and also the power 0.3 W/cm$^2$ having the frequency of 13.56 MHz is applied to the upper electrode 2.

As a result, TMS and $N_2O$ are plasmanized. The inter-wiring layer insulating film 34 made of the PE-CVD TMS $SiO_2$ film 22 of several tens nm thickness is formed while holding this condition for a predetermined time. According to the examination, the formed PE-CVD TMS $SiO_2$ film constituting the inter-wiring layer insulating film 34 has the relative dielectric constant of about 3.9 that is measured at the frequency of 1 MHz, and the leakage current of $10^{-8}$ A/cm$^2$ at the electric field strength of 5 MV/cm.

Then, the wiring-buried insulating film 35 made of an SiOF film having a film thickness of about 1 µm is formed on the inter-wiring layer insulating film 34 by the same method that is used to form the SiOF film 32.

Then, the connecting conductor 36 and the upper wiring 37 made mainly of a copper film 36b are formed by the well-known dual damascene method. Various methods are known as the dual damascene method, and then an example will be explained in detail herein.

That is, a resist film (not shown) is formed on the wiring-buried insulating film 35, and then an opening portion of the resist film is formed in the via-hole forming area by the photolithography method. Then, the wiring-buried insulating film 35 and the inter-wiring layer insulating film 34 are etched via the opening portion of the resist film to pass through. As a result, the via hole 34a is formed in the inter-wiring layer insulating film 34.

Then, another resist film (not shown) is formed, and then an opening portion is formed in the wiring-recess forming area. The opening portion in the resist film is formed to have an opening area larger than that of the via hole 34a in the inter-wiring layer insulating film 34 and to contain the via hole 34a in the inter-wiring layer insulating film 34 therein. Then, the wiring-buried insulating film 35 is etched via the opening portion of the resist film to pass through. At this time, since the underlying inter-wiring layer insulating film 34 has the etching resistance to the etching gas for the wiring-buried insulating film 35, the etching is stopped by the inter-wiring layer insulating film 34. As a result, the wiring recess 35a that is connected to the via-hole 34a is formed in the wiring-buried insulating film 35.

Then, TaN films 36a are formed on inner surfaces of the via-hole 34a and the wiring recess 35a like the above, then a copper seed layer is formed by the sputter method, and then the connecting conductor 36 and the upper wiring 37 are formed by filling a copper film 36b therein. The above procedures are the so-called dual damascene method.

Then, a protection layer 38 is formed on the overall surface by the film forming method to which the present invention is applied. Accordingly, the semiconductor device is completed.

As described above, according to the third embodiment of the present invention, the PE-CVD TMS $SiO_2$ film serving as the inter-wiring layer insulating film 34 is formed by plasmanizing the film forming gas, that consists of TMS as the alkoxy compound having Si—H bonds and $N_2O$ as the oxygen-containing gas, to react.

The PE-CVD TMS $SiO_2$ film according to the present invention has the relative dielectric constant of about 3.9 and has the denseness equivalent to the silicon nitride film. Therefore, the effective dielectric constant of the overall insulating film between the wirings can be reduced not to lower the function as the protection layer, i.e., while maintaining the high barrier characteristic to the copper and the small leakage current.

Figure 12A:
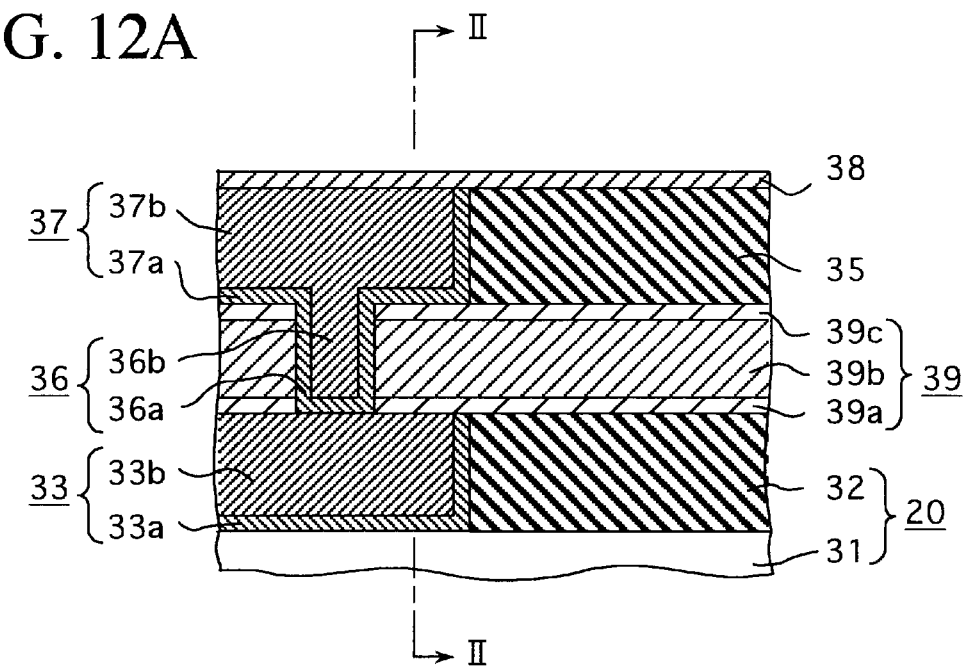
FIGS. 12A and 12B are sectional views showing a semiconductor device manufacturing method as a comparative example of the third embodiment of the present invention.
Figure 12B:
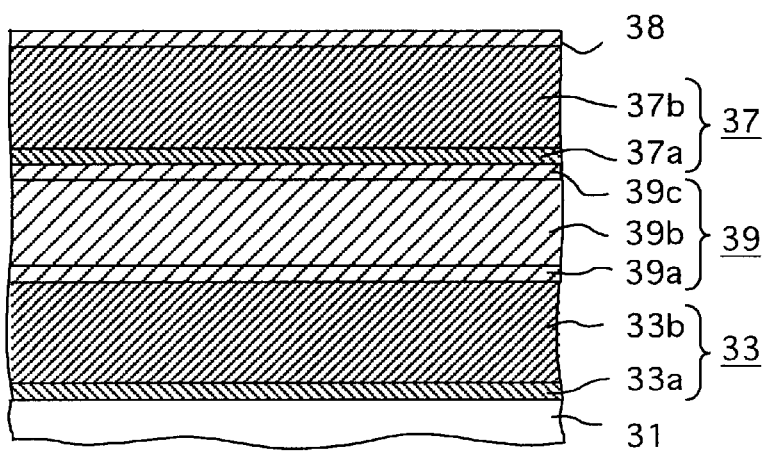

In contrast, FIGS. 12A and 12B are sectional views showing a multi-layered wiring structure according to a comparative example. A difference from FIGS. 11A and 11B resides in that an inter-wiring layer insulating film 39 in which a silicon oxide film 39b having a film thickness of about 1 µm is sandwiched by silicon nitride films 39a, 39c each having a film thickness of several tens nm is employed in place of the inter-wiring layer insulating film 34 made of the PE-CVD TMS $SiO_2$ film, to which the present invention is applied, and that a silicon nitride film 40 having a film thickness of several tens nm is employed in place of the protection layer 38 made of the PE-CVD TMS $SiO_2$ film. In this case, since the silicon nitride films 39a, 39c, 40 each having the high relative dielectric constant such as about 7.2 are employed, the dielectric constant of the overall insulating film between the wirings becomes high. In FIGS. 12A and 12B, the elements indicated by the same references as those in FIGS. 11A and 11B denote the same elements as those in FIGS. 11A and 11B, and their explanation will be omitted.

In this fashion, according to the third embodiment of the present invention, the diffusion of copper from the copper wirings 33, 37 can be blocked without the barrier insulating film like a silicon nitride, and the lower dielectric constant of the overall insulating film between the wirings can be achieved.

Also, the inter-wiring layer insulating film 34 made of the PE-CVD TMS $SiO_2$ film is interposed between the lower wiring-buried insulating film 32 and the upper wiring-buried insulating film 35 that are formed of the SiOF film, and also the upper most protection layer 38 made of the PE-CVD TMS $SiO_2$ film is formed to cover the upper wiring-buried insulating film 35. Therefore, the diffusion of the fluorine (F) element into the peripheral portions can be prevented by the inter-wiring layer insulating film 34 and the upper most protection layer 38. As a result, the reliability of the wirings can be improved.

In addition, since the inter-wiring layer insulating film 34 is formed to cover the lower wiring 33 formed mainly of the copper film 33a and the upper most protection layer 38 is formed to cover the upper wiring 37 formed mainly of the copper film 36a, the diffusion of the copper into the peripheral portions can be prevented Furthermore, since the leakage current of the insulating film itself of the present invention is essentially small like the silicon nitride film, the introduction of the oxygen is not required to reduce the leakage current, unlike the insulating film containing Si and C. Accordingly, there is no possibility such that surfaces of the copper films 33b, 37b of the upper and lower wirings 33, 37 are oxidized by the introduced oxygen or by the oxygen introducing process and thus the inter-wiring layer insulating film 34 and the barrier insulating film 38 which come into contact with the copper films 33b, 37b are ready to peel off.

The coating insulating film that is formed by the coating liquid containing the silicon-containing inorganic compound or the silicon-containing organic compound may be employed as the wiring-buried insulating films 32, 35. In this case, since the PE-CVD TMS $SiO_2$ film serving as the inter-wiring layer insulating films 34, or the protection layer 38 has the good adhesiveness to the coating insulating film, the peeling-off of the film can be prevented and also the discharge of the moisture from the coating insulating film to the peripheral portions can be prevented more completely.

(Fourth Embodiment)

Next, a semiconductor device and a semiconductor device manufacturing method according to a fourth embodiment of the present invention will be explained with reference to FIGS. 13A to 13G hereunder.

Figure 13A:
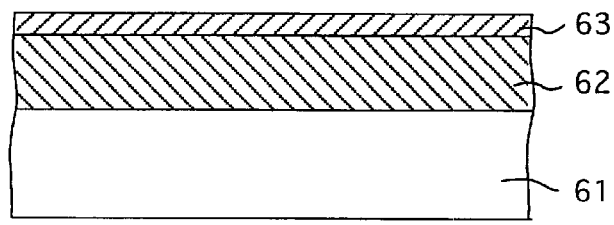
FIGS. 13A to 13G are sectional views showing a semiconductor device manufacturing method according to a fourth embodiment of the present invention.
Figure 13B:
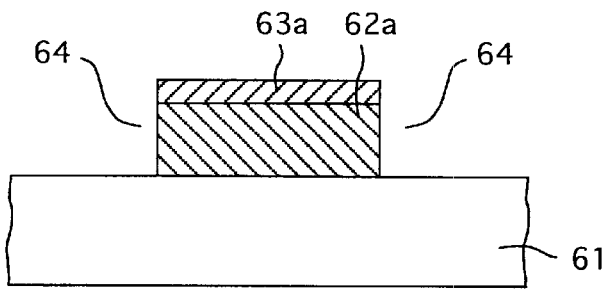
Figure 13C:
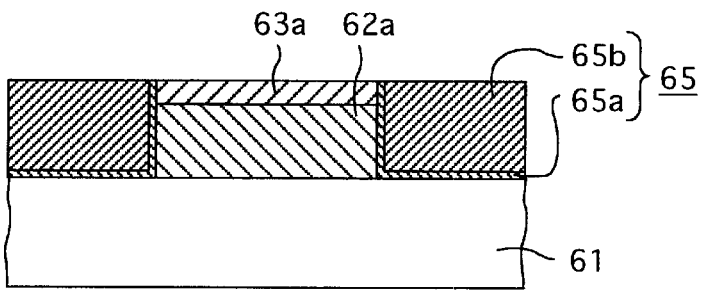
Figure 13D:
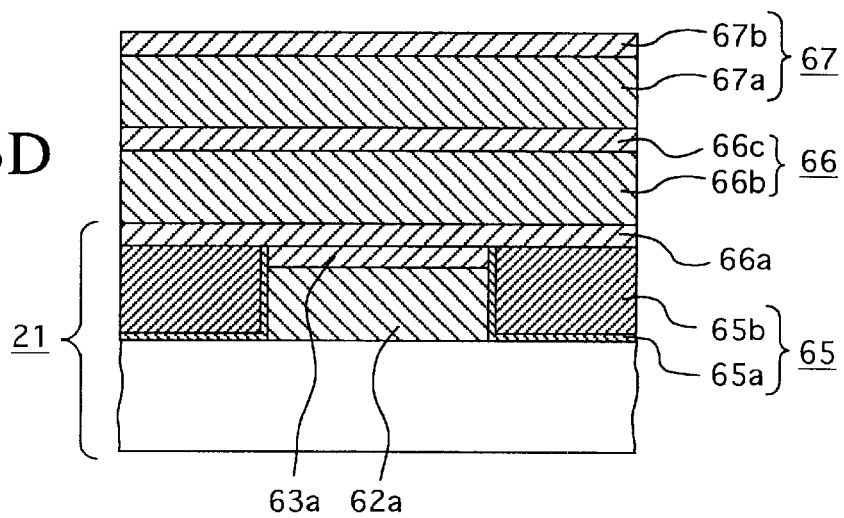
Figure 13E:
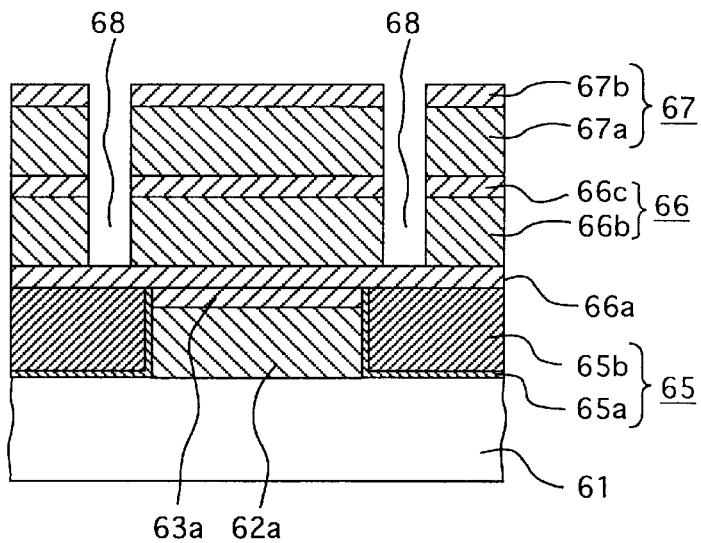
Figure 13F:
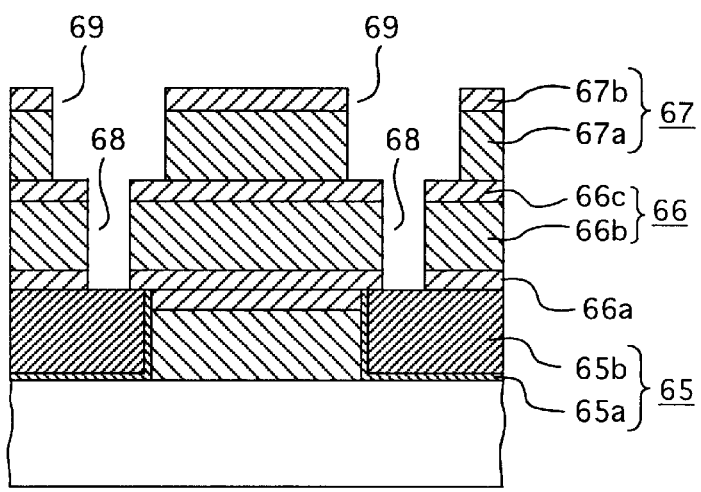
Figure 13G:
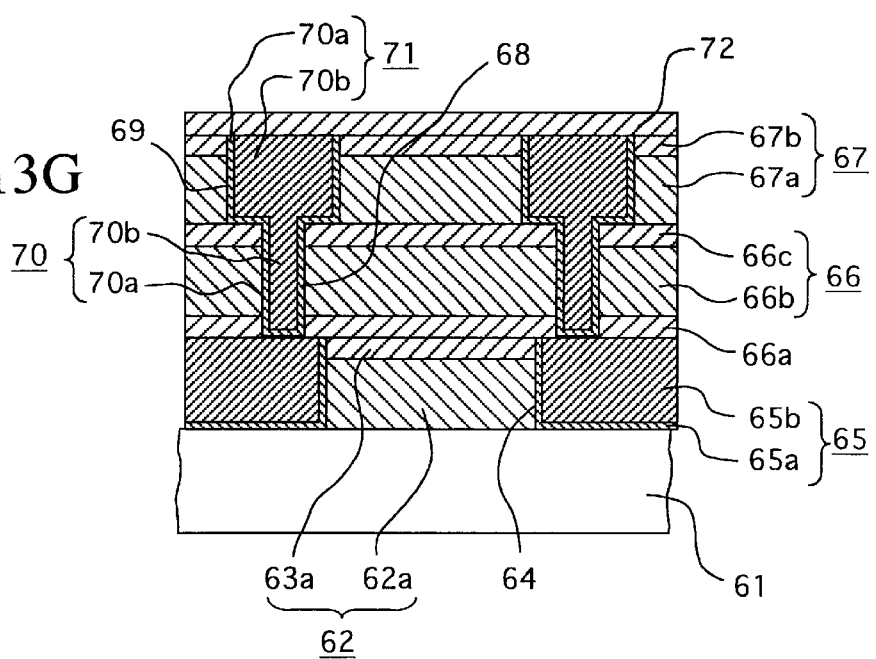

FIGS. 13G are sectional views showing the semiconductor device according to the fourth embodiment of the present invention.

As shown in FIG. 13G, this semiconductor device is provided with a lower wiring-buried insulating film 62 on a base substrate 61. The lower wiring-buried insulating film 62 is formed by laminating a main insulating film 62a and a first upper protection layer 63a made of the PE-CVD $SiO_2$ film with a thickness of approximately 50 nm. A lower wiring 65 consisting of a TaN film 65a as a copper diffusion preventing film and a copper film 65b are buried in lower wiring recess 64 piercing the lower wiring-buried insulating film 62. A semiconductor substrate, the other conductive layer or an insulating substrate may be employed as the base substrate 61.

This semiconductor device is provided on the aforementioned elements with an inter-wiring layer insulating film 66 having a via-hole 68 and an upper wiring-buried insulating film 67 burying an upper wiring 71 in wiring recess 69.

The inter-wiring layer insulating film 66 is constituted by a second lower protection layer 66a made of the PE-CVD $SiO_2$ film of the present invention with a thickness of approximately 50 nm, a main insulating film 66b, and a second upper protection layer 66c made of the PE-CVD $SiO_2$ film of the present invention with a thickness of approximately 50 nm. The upper wiring-buried insulating film 67 is constituted by a main insulating film 67a and a third upper protection layer 67b made of the PE-CVD $SiO_2$ film of the present invention with a thickness of approximately 50 nm.

The upper wiring recess 69 has a larger opening area than the via-hole 68, and is formed to connect to the via-hole 68. In the via-hole 68 and the upper wiring recess 69 are buried integrally a connecting conductor 70 consisting of a TaN film 70a as a copper diffusion preventing film and a copper film 70b, and an upper wiring 71 consisting of a TaN film 70a as a copper diffusion preventing film and a copper film 70b. And an entire uppermost surface is covered with an uppermost protection layer 72 made of the PE-CVD $SiO_2$ film of the present invention.

A SiOF film or a porous insulating film having a lower dielectric constant may be employed as the above main insulating film 62a, 66b, 67a.

The PE-CVD TMS $SiO_2$ film according to the present invention has a peak of an absorption intensity of an infrared rays in a range of a wave number 2270 to 2350 $cm^{-1}$, a film density in a range of 2.25 to 2.40 $g/cm^3$, and a relative dielectric constant in a range of 3.3 to 4.3.

As described above, the PE-CVD TMS $SiO_2$ film having the aforementioned characteristics has a high mechanical strength, is dense, has a high water resistance, and has a small content of moisture similarly to a silicon nitride film, and is a lower relative dielectric constant than the silicon nitride.

According to this embodiment, the main insulating film 62a of the lower wiring-buried insulating film 62 is covered with the protection layer 63a made of the PE-CVD TMS $SiO_2$ film having the aforementioned characteristics, and the main insulating film 66b, 67a are covered with the protection layer 66a, 66c, and the protection layer 66c, 67b made of the PE-CVD TMS $SiO_2$ film having the aforementioned characteristics, respectively. Therefore, the protection layer 66a, 66c, 67b can prevent an incoming moisture from penetrating into the main insulating film 63a, 66b, 67a, and can prevent a relative dielectric constant of the main insulating film 63a, 66b, 67a from changing. Further, since the protection layer 66a, 66c, 67b can prevent the moisture from penetrating into the interior of the semicondutor, a corrosion of the wiring 65, 71 can be prevented.

Moreover, since the protection layer 63a, 66a, 66c, 67b is formed of not a silicon nitride film but the PE-CVD TMS $SiO_2$ film having a lower relative dielectric constant, an overall insulating film interposed between the wiring 65, 71 can be reduced in a dielectric constant.

Further, the protection layer 66a made of the PE-CVD TMS $SiO_2$ film having the aforementioned characteristics is formed to cover the lower wiring 65, particularly the copper film 65b, and the uppermost protection layer 72 made of the PE-CVD TMS $SiO_2$ film having the aforementioned characteristics is formed to cover the upper wiring 71, particularly the copper film 70b. Therefore, the protection layer 66a, 72 can prevent the copper from diffusing from the wiring 65, 71 made mainly of the copper film 65b, 70b to the periphery thereof.

FIGS. 13A to 13G are sectional views showing the semiconductor device manufacturing method according to the fourth embodiment of the present invention. TMS+$N_2O$ is used as the film forming gas for the protection layers 63a, 66a, 66c, 67b, 72.

First, as shown in FIG. 13A, an underlying insulating film 62a made of the thermal oxide film, the BPSG film, or the like is formed on a base substrate 61, and then a PE-CVD TMS $SiO_2$ film 63a having a film thickness of about 50 nm is formed by the plasma CVD method using TMS+$N_2O$ as the film forming gas. The formed PE-CVD TMS $SiO_2$ film 63a has the relative dielectric constant of about 3.9 that is measured at the frequency of 1 MHz, and the leakage current of $10^{-8}$ $A/cm^2$ at the electric field strength of 5 MV/cm.

Then, as shown in FIG. 13B, wiring recesses 64 are formed by patterning the PE-CVD TMS $SiO_2$ film 63a and the underlying insulating film 62a. A PE-CVD TMS $SiO_2$ film 63a acts as the protection layer.

Then, as shown in FIG. 13C, a TaN film 65a is formed as a copper diffusion preventing film on inner surfaces of the wiring recesses 64. Then, a copper seed layer (not shown) is formed and then a copper film 65b is filled to form a lower wiring 65 consisting of the TaN film 65a and the copper film 65b.

Then, as shown in FIG. 13D, a barrier insulating film 66a made of the PE-CVD TMS $SiO_2$ film of the present invention to cover the lower wiring 65 is formed, and then an insulating film 66b as a main body of the inter-wiring layer insulating film 66 and a protection layer 66c made of the PE-CVD TMS SiO$_2$ film of the present invention are formed, whereby an inter-wiring layer insulating film 66 into which the connecting conductor is to be buried is formed. Then, a main insulating film 67a of the wiring-buried insulating film and a protection layer 67b made of the PE-CVD TMS SiO$_2$ film of the present invention are formed on the protection layer 66c in the same manner, whereby a wiring-buried insulating film 67 into which the upper wiring is to be buried is formed. In this case, the SiOF film having the low dielectric constant is employed as the main insulating film 66b of the inter-wiring layer insulating film 66 and the main insulating film 67a of the wiring-buried insulating film 67, similarly to in the third embodiment.

Then, as shown in FIGS. 13E to 13G, a connecting conductor 70 and an upper wiring 71 are formed by the well-known dual damascene method. The dual damascene method will be explained in detail hereunder.

That is, a resist film (not shown) is formed on the protection layer 67b, and then opening portions are formed in the via-hole forming areas of the resist film by the photolithography method. Then, the protection insulating film 67b, the main insulating film 67a, the protection layer 66c, and the main insulating film 66b are etched via the opening portions in the resist film to pierce them. As a result, opening portions 68 are formed in the protection insulating film 66c and the main insulating film 66b of the inter-wiring layer insulating film 66.

Then, another resist film (not shown) is formed and then opening portions are formed in the wiring-recess forming areas. The opening portions in this resist film are formed to have a larger opening area than the first opening portions and to include the first opening portions. Then, the protection layer 67b and the main insulating film 67a are etched via the opening portions in the resist film to pierce them. At this time, since the underlying protection layer 66c had the etching resistance to the etching gas for the main insulating film 67a, the etching is stopped by the protection layer 66c. Accordingly, wiring recesses are formed in the wiring-buried insulating film 67. Then, via holes 68 are formed by etching the protection layer 66a to pierce the protection layer 66a. As a result, the lower wiring 65 is exposed from bottom portions of the via holes 68 and thus the lower wiring 65 and the wiring recesses 69 are connected mutually via the via holes 68.

Then, TaN films 70a are formed on inner surfaces of the via holes 68 and the wiring recesses 69, then a copper seed layer (not shown) is formed, and then copper films 70b are filled thereon, whereby a connecting conductor 70 and an upper wiring 71 are formed. The above is the so-called dual damascene method.

Then, a protection layer 72 made of the PE-CVD TMS SiO$_2$ film is formed on the entire surface by the film forming method to which the present invention is applied.

As described above, according to the semiconductor manufacturing method of the fourth embodiment, the method is performed to form the inter-wiring layer insulating film 66 and the wiring-buried insulating film 67 by laminating sequentially the insulating film and the protection layer from the bottom, and then to pass through the protection layer, the inter-wiring layer insulating film 66 and the wiring-buried insulating film 67 such that their opening areas are expanded sequentially from the lower side respectively so as to form alternatively the via holes 68 and the wiring recesses 69 connected to the via holes 68. In other words, the protection layer 66c acts as the underlying film of the main insulating film 67a that is etched to selectively etch the insulating film 67a. Since the protection layer 66c to which the present invention is applied is dense, such film can effectively function as the mask or such film can effectively function as the stopper to prevent the excessive etching of the underlying insulating film 66b.

In this case, the coating insulating film having the low dielectric constant may be employed as the main insulating films 66b, 67a in place of the SiOF film.

(Fifth Embodiment)

Next, a semiconductor device and a semiconductor device manufacturing method according to a fifth embodiment of the present invention will be explained with reference to FIG. 14 hereunder.

Figure 14:
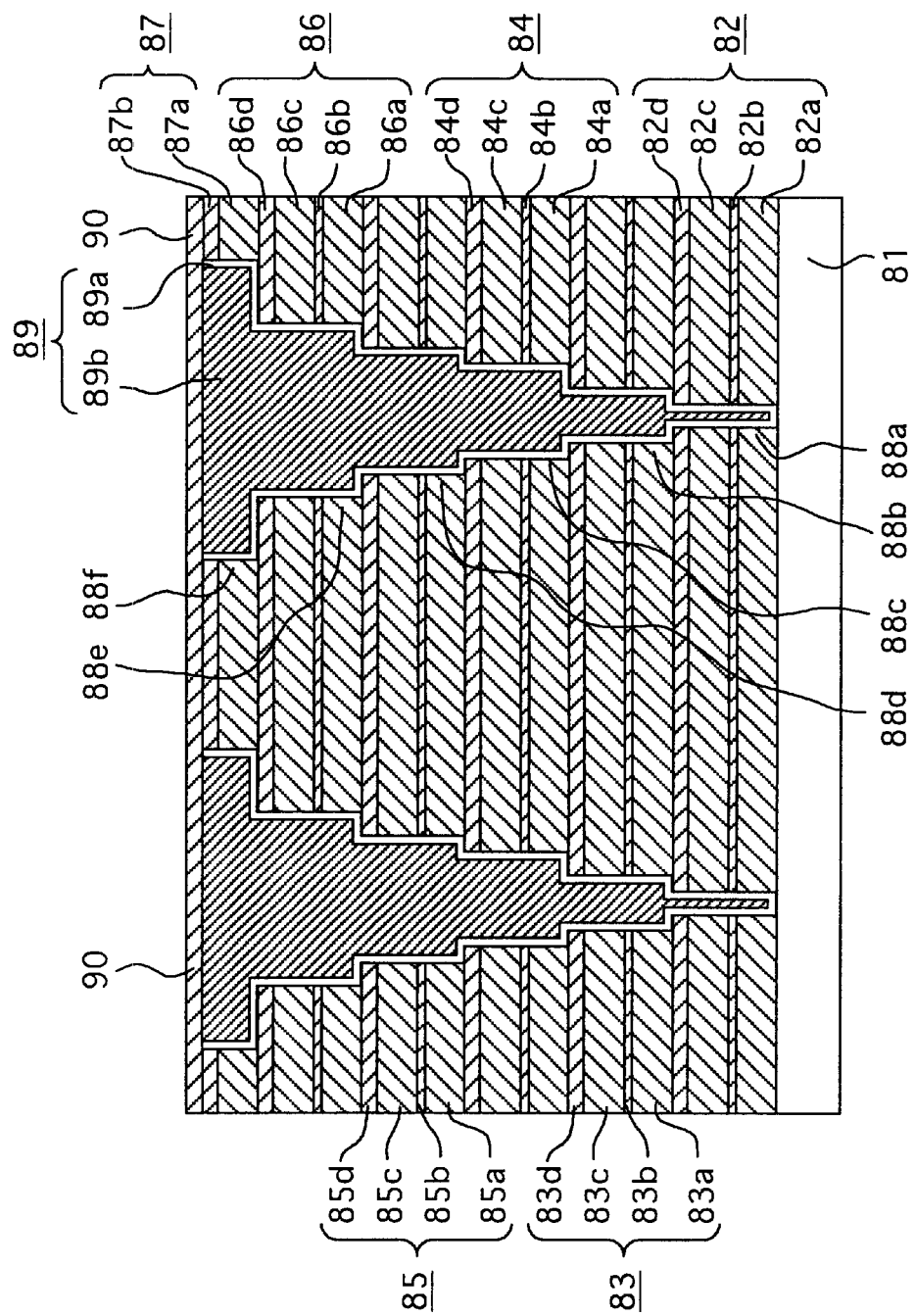
FIG. 14 is a sectional view showing a semiconductor device manufacturing method according to a fifth embodiment of the present invention.

FIG. 14 is a sectional view showing the semiconductor device according to the fifth embodiment of the present invention.

The semiconductor device according to this embodiment is provided with a laminated structure which is formed by laminating sequentially an inter-wiring layer insulating film 82, a wiring-buried insulating film 83, an inter-wiring layer insulating film 84, a wiring-buried insulating film 85, an inter-wiring layer insulating film 86, and a wiring-buried insulating film 87 on a substrate 81 from the bottom.

More in detail, it is formed by alternatively laminating insulating films 82a/82c, 83a/83c, 84a/84c, 85a/85c, 86a/86c, 87a formed of the low dielectric constant insulating film, that is the main body of the inter-wiring layer insulating films 82, 84, 86 and the wiring-buried insulating films 83, 85, 87 respectively, and protection layers 82d, 83d, 84d, 85d, 86d, 87b formed of the PE-CVD TMS SiO$_2$ film of the present invention. The PE-CVD TMS SiO$_2$ film according to the present invention has a peak of an absorption intensity of an infrared rays in a range of a wave number 2270 to 2350 cm$^{-1}$, a film density in a range of 2.25 to 2.40 g/cm$^3$, and a relative dielectric constant in a range of 3.3 to 4.3.

In this case, the above SiOF film or the above coating insulating film may be employed as the insulating films 82a/82c, 83a/83c, 84a/84c, 85a/85c, 86a/86c, 87a formed of the low dielectric constant insulating film.

That is, the inter-wiring layer insulating films 82, 84, 86 are formed by laminating the main insulating films 82a/82c, 84a/84c, 86a/86c and the protection layers 82d, 84d, 86d sequentially from the bottom. Also, the wiring-buried insulating films 83, 85, 87 are formed by laminating the main insulating films 83a/83c, 85a/85c, 87a and the protection layers 83d, 85d, 87b sequentially from the bottom.

In this fifth embodiment, the insulating films (the protection layer) 82b, 84b, 86b made of the PE-CVD TMS SiO$_2$ film of the present invention are interposed between the main insulating films 82a/82c, 84a/84c, 86a/86c of the inter-wiring layer insulating films 82, 84, 86 respectively, and also the insulating films (the protection layer) 83b, 85b made of the PE-CVD TMS SiO$_2$ film of the present invention are interposed between the main insulating films 83a/83c, 85a/85c of the wiring-buried insulating films 83, 85. Since the cracks are ready to occur due to the stress in the low dielectric constant insulating film as the main insulating film, the insulating films 82b, 84b, 86b and the insulating films 83b, 85b are interposed to prevent such cracks.

Then, the via holes 88a, 88c, 88e are formed in the inter-wiring layer insulating films 82, 84, 86, and the wiring recesses 88b, 88d, 88f are formed in the wiring-buried insulating films 83, 85, 87. That is, the via holes 88a, 88c, 88e and the wiring recesses 88b, 88d, 88f are formed alternatively such that their opening areas are expanded sequentially from the lower side and that the via holes 88a, 88c, 88e and the neighboring wiring recesses 88b, 88d, 88f are connected mutually.

A copper diffusion preventing film 89*a* made of a TaN film is formed on inner surfaces of the via holes 88*a*, 88*c*, 88*e* and the wiring recesses 88*b*, 88*d*, 88*f,* and then a copper film 89*b* is buried therein via the copper diffusion preventing film 89*a*. The copper diffusion preventing film 89*a* and the copper film 89*b* buried in the via holes 88*a*, 88*c*, 88*e* act as the connecting conductor for connecting the upper and lower wirings respectively. The copper diffusion preventing film 89*a* and the copper film 89*b* buried in the wiring recesses 88*b*, 88*d*, 88*f* constitutes the wiring respectively.

A protection layer 90 made of the PE-CVD TMS $SiO_2$ film, that is the insulating film of the present invention, is formed on the uppermost portion to cover the uppermost wiring.

The structure constructed by burying the wiring formed of the copper film or formed mainly of the copper film in the wiring-buried insulating film like the substrate 21 in FIG. 13D, for example, may be employed as the substrate 81. In this case, this wiring is connected to the connecting conductor 89 in the via hole 88*a* formed in the protection layer covering the wiring as well.

As described above, according to the semiconductor device of the fifth embodiment, although the multi-layered wiring has three layers in the number of layers and its number is more than that of the fourth embodiment, the same advantages as the fourth embodiment are obtained.

The manufacturing method explained in the fourth embodiment may be employed as the above semiconductor device manufacturing method. Such manufacturing method will be explained in brief hereunder. In this case, TMS+$N_2O$ is employed as a film forming gas of the protection layers 82*d*, 83*d*, 84*d*, 85*d*, 86*d*, 87*d* and the insulating films 82*b*, 83*b*, 84*b*, 85*b*, 86*b*.

That is, like FIG. 13D, the low dielectric constant insulating films 82*a*, 82*c*, 83*a*, 83*c*, 84*a*, 84*c*, 85*a*, 85*c*, 86*a*, 86*c*, 87*a* (referred to as "82*a* to 87*a*" hereinafter) and the insulating films 82*b*, 82*d*, 83*b*, 83*d*, 84*b*, 84*d*, 85*b*, 85*d*, 86*b*, 86*d*, 87*b* made of the PE-CVD TMS $SiO_2$ film (referred to as "82*b* to 87*b* " hereinafter) are formed alternatively from the lower side on the substrate 81. The insulating films 82*a* to 82*d* are referred to as the inter-wiring layer insulating film 82, the insulating films 83*a* to 83*d* are referred to as the inter-wiring layer insulating film 83, the insulating films 84*a* to 84*d* are referred to as the inter-wiring layer insulating film 84, the insulating films 85*a* to 85*d* are referred to as the inter-wiring layer insulating film 85, the insulating films 86*a* to 86*d* are referred to as the inter-wiring layer insulating film 86, and the insulating films 87*a* and 87*b* are referred to as the inter-wiring layer insulating film 87. That is, the inter-wiring layer insulating film 82, etc. and the wiring-buried insulating film 83, etc. are constituted by at least two sets as a set consisting of the insulating film 82*a* to 87*a* as a lower layer and the protection layer 82*b* to 87*b* as a upper layer.

Then, like FIGS. 13E and 13F, opening portions 88*a* to 88*f* are formed in the inter-wiring layer insulating films 82, etc. and the wiring-buried insulating films 83, etc., which are laminated alternatively, to pass through such that their opening areas are expanded sequentially and that they are connected mutually. These opening portions 88*a* to 88*f* serve as the via holes 88*a*, 88*c*, 88*e* and the wiring recesses 88*b*, 88*d*, 88*f* connected to these via holes.

Then, like FIG. 13G, the connecting conductors and the wirings 89*a*, 89*b* are formed such that the wirings in the upper and lower wiring recesses 88*b*, 88*d*, 88*f* are connected via the connecting conductors formed in the via holes 88*a*, 88*c*, 88*e*.

After this, the protection layer 90 formed of the PE-CVD TMS $SiO_2$ film of the present invention is formed, whereby the semiconductor device is completed.

As described above, according to the semiconductor device manufacturing device of the fifth embodiment, the number of layers in the multi-layered wiring, i.e., three layers, is larger than the fourth embodiment, nevertheless the advantages similar to the fourth embodiment can be achieved.

With the above, the present invention is explained in detail based on the embodiments, but the scope of the present invention is not limited to examples given concretely in the above embodiments. Variations of the above embodiments may be contained in the scope of the present invention without departing from the gist of the present invention.

As described above, the silicon-containing insulating film according to the present invention has a peak of an absorption intensity of an infrared rays in a range of a wave number 2270 to 2350 $cm^{-1}$, a film density in a range of 2.25 to 2.40 $g/cm^3$, and a relative dielectric constant in a range of 3.3 to 4.3.

The semiconductor device of the present invention has a protection layer covering a wiring made only or mainly of a copper film, and the protection layer is formed of the silicon-containing insulating film having the aforementioned characteristics. Accordingly, since the protection layer is dense similarly to a silicon nitride, it can prevent the copper from diffusing to a periphery of the wiring.

Further, an inter-wiring layer insulating film having the aforementioned characteristics is interposed between the lower wiring and the upper wiring. Therefore, the inter-wiring layer insulating film can prevent the copper from diffusing from the wiring to a periphery thereof, while the semiconductor device maintains a lower dielectric constant.

Moreover, the semiconductor device has a main insulating film, protection layers covering it in both a lower surface and an upper surface. In other words, the protection layers having the aforementioned characteristics are interposed both between the lower wiring and the main insulating film and between the upper wiring and the main insulating film, respectively. Therefore, the protection layers can prevent the copper from diffusing from the wirings to the main insulating film.

Further, employing a porous insulating film or a coating insulating film having a lower dielectric constant as the main insulating film results in preventing the copper from diffusing to the main insulating film from the wirings while maintaining a lower dielectric constant.

According to the semiconductor manufacturing method of the present invention, the silicon-containing insulating film is formed by plasmanizing the film forming gas, that consists of any one selected from the group consisting of the alkoxy compound having Si—H bonds and the siloxane having Si—H bonds and any one oxygen-containing gas selected from the group consisting of $O_2$, $N_2O$, $NO_2$, $CO$, $CO_2$, and $H_2O$, to react.

The silicon-containing insulating film formed by the above film-forming condition is dense, is excellent in the water resistance, has the small amount of contained moisture in the film, and has the small relative dielectric constant.

Therefore, in the method of manufacturing the semiconductor device in which the inter-wiring layer insulating film is put between the lower wiring-buried insulating film into which the lower wiring formed only or mainly of the copper film is buried and the upper wiring-buried insulating film into which the upper wiring formed only or mainly of the copper film is buried, if the silicon-containing insulating film formed by the above film-forming condition is formed as the inter-wiring layer insulating film, the diffusion of the copper from the lower wiring and the upper wiring can be prevented without the barrier insulating film and also the lower dielectric constant can be achieved in the overall insulating film between the wirings.

Also, the main insulating films and the protection layers made of the silicon-containing insulating film of the present invention are laminated alternatively to form a multi-layered structure with the inter-wiring layer insulating films and the wiring-buried insulating films laminated alternatively two layers or more. Then, the via holes and the wiring recesses are formed in the inter-wiring layer insulating films and the wiring-buried insulating films, and then the connecting conductor and the wiring are buried in the via holes and the wiring recesses. Therefore, since the protection layer is interposed between the wiring and the main insulating film, the diffusion of the copper from the copper wirings into the main insulating film can be prevented.

In addition, since the lower wiring is covered with the protection layer made of the silicon-containing insulating film of the present invention, the diffusion of the copper into the peripheral portions can be prevented. Also, since the insulating film itself of the present invention has essentially the small leakage current like the silicon nitride film, the introduction of the oxygen is not needed to reduce the leakage current, unlike the insulating film containing Si and C. Therefore, there is no possibility that a peeling-off of the protection layer, etc. that contacts to the wiring is caused by the introduced oxygen or the oxygen introducing process.

Furthermore, since the insulating film having the low relative dielectric constant is employed not to employ the silicon nitride film as the protection layer, the insulating film between the wirings as a whole can be reduced in the dielectric constant.

What is claimed is:

1. A semiconductor device manufacturing method of manufacturing a semiconductor device which comprises a lower wiring-buried insulating film, an inter-wiring layer insulating film, an upper wiring-buried insulating film that are laminated in this order from a lower side, and further comprising a lower wiring formed of a copper film or formed mainly of a copper film buried in the lower wiring-buried insulating film, and an upper wiring formed of a copper film or formed mainly of a copper film buried in the upper wiring-buried insulating film, wherein the inter-wiring layer insulating film is formed by plasmanizing a film forming gas, that consists of any one selected from a group consisting of alkoxy compound having Si—H bonds and siloxane having Si—H bonds and any one oxygen-containing gas selected from a group consisting of $O_2$, $N_2O$, $NO_2$, $CO$, $CO_2$, and $H_2O$, to react.

2. A semiconductor device manufacturing method according to claim 1, wherein a via hole is formed in the inter-wiring layer insulating film, and a connecting conductor formed of a copper film or formed mainly of a copper film is buried in the via hole to connect the lower wiring and the upper wiring.

3. A semiconductor device manufacturing method according to claim 1, wherein the lower wiring-buried insulating film and the upper wiring-buried insulating film are formed of an insulating film having a relative dielectric constant of less than 4.0, respectively.

4. A semiconductor device manufacturing method according to claim 1, wherein at least any one selected from a group consisting of the lower wiring-buried insulating film and the upper wiring-buried insulating film is formed of an insulating film that contains silicon (Si), oxygen (O) and fluorine (F) or a porous insulating film that contains silicon (Si), oxygen (O) and fluorine (F).

5. A semiconductor device manufacturing method according to claim 1, wherein any one of $N_2$ and $H_2$ is added to the film forming gas used to form the inter-wiring layer insulating film.

6. A semiconductor device manufacturing method according to claim 1, wherein the alkoxy compound having Si—H bonds is formed of trimethoxysilane (TMS:SiH(OCH$_3$)$_3$).

7. A semiconductor device manufacturing method according to claim 1, wherein the siloxane having Si—H bonds is formed of tetramethyldisiloxane (TMDSO:(CH$_3$)$_2$HSi—O—SiH(CH$_3$)$_2$).

8. A semiconductor device manufacturing method according to claim 1, wherein a first and second electrodes of parallel-plate type are employed as a plasma generating means, and, when a film is formed, a high frequency power having a frequency of 1 MHz or more is applied to the first electrode and a low frequency power having a frequency of 100 kHz to 1 MHz is applied to the second electrode on which a substrate is loaded.

9. A semiconductor device manufacturing method comprising the steps of:
   (a) laminating an insulating film and a protection layer alternatively from a bottom on a substrate to form alternatively an inter-wiring layer insulating film and a wiring-buried insulating film so as to exceed two layers or more, wherein the inter-wiring layer insulating film includes at least a set of the insulating film and the protection layer that are laminated in this order from the lower side, and the wiring-buried insulating film includes at least a set of the insulating film and the protection layer that are laminated in this order from the lower side;
   (b) piercing the inter-wiring layer insulating film and the wiring-buried insulating film to form opening portions which have opening areas being expanded sequentially from the lower side and are connected mutually between the adjacent opening portions, so as to form alternatively via holes in the inter-wiring layer insulating films and wiring recesses in the wiring-buried insulating films; and
   (c) filling the via holes and the wiring recesses with a metal film made of a copper film or made mainly of a copper film to form connecting conductors in the via holes and wirings in the wiring recesses in which each is connected to the connecting conductor,
   wherein the protection layer is formed by plasmanizing a film forming gas, that consists of any one selected from a group consisting of alkoxy compound having Si—H bonds and siloxane having Si—H bonds and any one oxygen-containing gas selected from a group consisting of $O_2$, $N_2O$, $NO_2$, $CO$, $CO_2$, and $H_2O$, to react.

10. A semiconductor device manufacturing method according to claim 9, wherein the substrate has a lower wiring and a protection layer covering the lower wiring to contact the lower wiring, the protection layer is formed by plasmanizing the film forming gas, that consists of any one selected from the group consisting of alkoxy compound having Si—H bonds and siloxane having Si—H bonds and any one oxygen-containing gas selected from the group consisting of $O_2$, $N_2O$, $NO_2$, $CO$, $CO_2$, and $H_2O$, to react, and the protection layer is pierced to expose the lower wiring layer when the via holes and the wiring recesses are formed in the step of (b).

11. A semiconductor device manufacturing method according to claim 9, wherein the insulating film is a coating insulating film that is formed by coating any one selected from a group consisting of a coating liquid containing silicon-containing inorganic substance and a coating liquid containing silicon-containing organic substance.

12. A semiconductor device manufacturing method according to claim 9, wherein the inter-wiring layer insulating films and the wiring-buried insulating films are formed by laminating at least two sets in which each set is constituted by the insulating film as a lower layer and the protection layer as an upper layer.

13. A semiconductor device manufacturing method according to claim 9, wherein the metal film is formed of a copper diffusion preventing film and the copper film, and the step of filling the via holes and the wiring recesses is constituted by steps of forming a copper diffusion preventing film on inner surfaces of the via holes and the wiring recesses, and forming the copper film on the copper diffusion preventing film.

14. A semiconductor device manufacturing method according to claim 9, wherein any one of $N_2$ and $H_2$ is added to the film forming gas used to form the protection layer.

15. A semiconductor device manufacturing method according to claim 9, wherein the alkoxy compound having Si—H bonds is formed of trimethoxysilane (TMS:SiH (OCH$_3$)$_3$).

16. A semiconductor device manufacturing method according to claim 9, wherein the siloxane having Si—H bonds is formed of tetramethyldisiloxane (TMDSO: (CH$_3$)$_2$ HSi—O—SiH(CH$_3$)$_2$).

17. A semiconductor device manufacturing method according to claim 9, wherein a first and second electrodes of parallel-plate type are employed as a plasma generating means, and, when a film is formed, a high frequency power having a frequency of 1 MHz or more is applied to the first electrode and a low frequency power having a frequency of 100 kHz to 1 MHz is applied to the second electrode on which a substrate is loaded.

* * * * *

UNITED STATES PATENT AND TRADEMARK OFFICE
CERTIFICATE OF CORRECTION

PATENT NO. : 6,500,752 B2
DATED : December 31, 2002
INVENTOR(S) : Oku et al.

It is certified that error appears in the above-identified patent and that said Letters Patent is hereby corrected as shown below:

Column 3,
Line 28, "the," should read -- the --.

Column 5,
Line 48, "as a." should read -- as a --.

Column 6,
Line 41, "lie" should read -- 11e --.

Column 7,
Line 23, "film)," should read -- film) --.

Column 8,
Line 34, "curling" should read -- curing --.

Column 9,
Line 21, "change:" should read -- change --; and
Line 64, "TMS0" should read -- TMS --.

Signed and Sealed this

Fourteenth Day of September, 2004

JON W. DUDAS
*Director of the United States Patent and Trademark Office*